(12) United States Patent
Sheng et al.

(10) Patent No.: US 8,728,918 B2
(45) Date of Patent: May 20, 2014

(54) METHOD AND APPARATUS FOR FABRICATING SILICON HETEROJUNCTION SOLAR CELLS

(71) Applicant: Applied Materials, Inc., Santa Clara, CA (US)

(72) Inventors: Shuran Sheng, Santa Clara, CA (US); Lin Zhang, San Jose, CA (US); Zheng Yuan, Cupertino, CA (US); Rongping Wang, Cupertino, CA (US); Alan Tso, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 18 days.

(21) Appl. No.: 13/656,420

(22) Filed: Oct. 19, 2012

(65) Prior Publication Data
US 2013/0102133 A1  Apr. 25, 2013

Related U.S. Application Data

(60) Provisional application No. 61/550,312, filed on Oct. 21, 2011.

(51) Int. Cl.
H01L 21/20 (2006.01)
(52) U.S. Cl.
USPC .......................................................... 438/478
(58) Field of Classification Search
USPC ......................................................... 438/478
See application file for complete search history.

(56) References Cited

U.S. PATENT DOCUMENTS

| | | |
|---|---|---|
| 2004/0082193 A1 | 4/2004 | Rocha-Alvarez et al. |
| 2006/0169578 A1 | 8/2006 | Brown et al. |
| 2008/0182417 A1 | 7/2008 | Collins et al. |
| 2009/0227061 A1* | 9/2009 | Bateman et al. ................ 438/57 |
| 2010/0116334 A1 | 5/2010 | Xu et al. |
| 2011/0129959 A1* | 6/2011 | Moffatt .......................... 438/97 |

OTHER PUBLICATIONS

International Search Report and Written Opinion of the International Searching Authority mailed Mar. 25, 2013, in PCT/US2012/060940.
International Search Report and Written Opinion of the International Searching Authority mailed Mar. 25, 2013, in PCT/US2012/061162.

* cited by examiner

*Primary Examiner* — Bradley K Smith
(74) *Attorney, Agent, or Firm* — Patterson & Sheridan, LLP

(57) ABSTRACT

A method for fabricating a semiconductor layer within a plasma enhanced chemical vapor deposition (PECVD) apparatus. The PECVD apparatus includes a plurality of walls defining a processing region, a substrate support, a shadow frame, a gas distribution showerhead, a gas source in fluid communication with the gas distribution showerhead and the processing region, a radio frequency power source coupled to the gas distribution showerhead, and one or more VHF grounding straps electrically coupled to at least one of the plurality of walls. The VHF grounding straps provide a low-impedance current path between at least one of the plurality of walls and at least one of a shadow frame or the substrate support. The method further includes delivering a semiconductor precursor gas and a dopant precursor gas and delivering a very high frequency (VHF) power to generate a plasma to form a first layer on the one or more substrates.

17 Claims, 17 Drawing Sheets

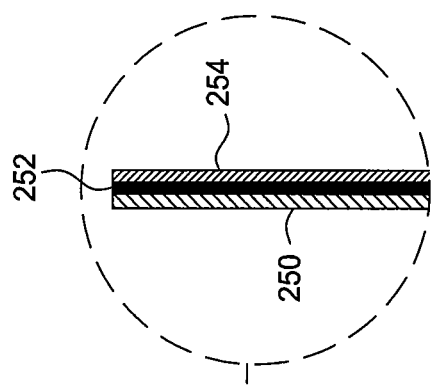
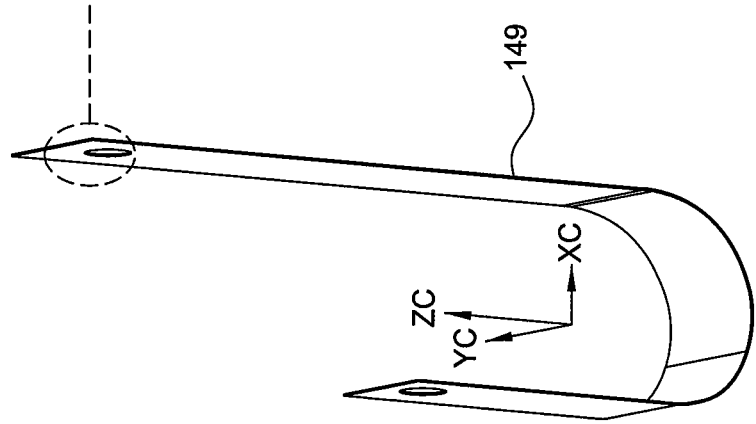
FIG. 2F
FIG. 2E

| | Earlier RF process | New VHF process |
|---|---|---|
| RF Frequency | 13.56 MHz | 40 MHz |
| Substrate Temperature | 225-300°C | 120-230°C |
| Deposition Rate | >5Å/s for p, i, n layers | <2.5Å/s for p, i, n layers |
| SRV | >10cm/s @ 50Å thickness | <5cm/s @ 50Å thickness |

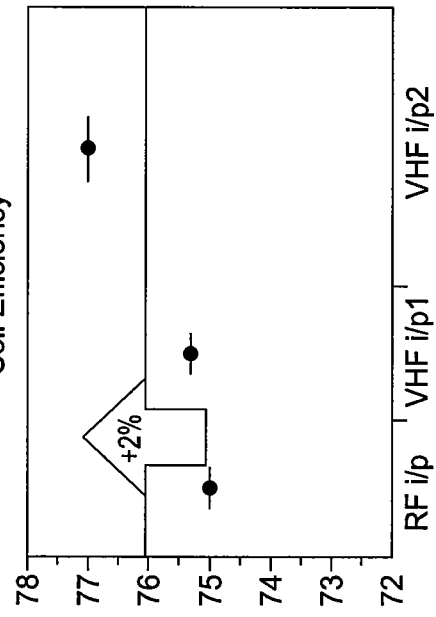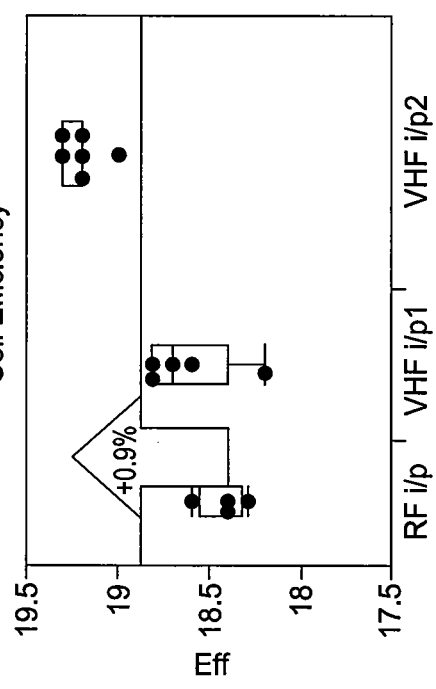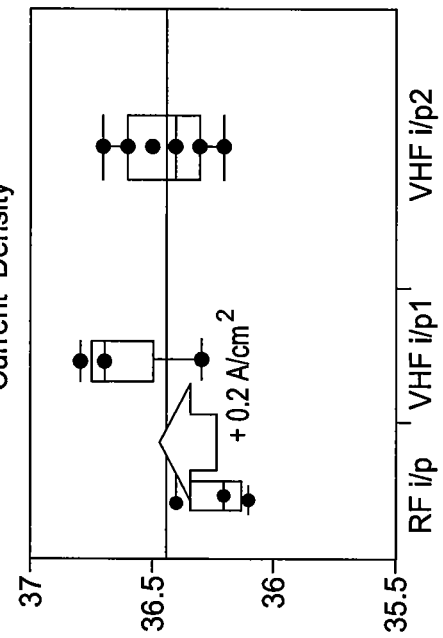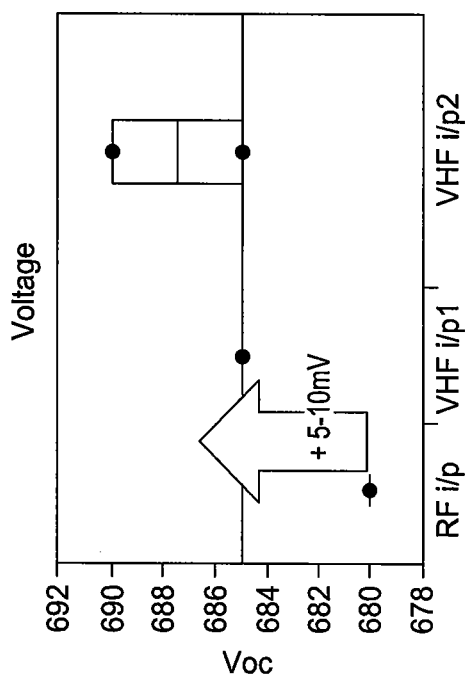
FIG. 12A
FIG. 12B
FIG. 12C
FIG. 12D

METHOD AND APPARATUS FOR FABRICATING SILICON HETEROJUNCTION SOLAR CELLS

CROSS-REFERENCE TO RELATED APPLICATIONS

This application claims benefit of U.S. Provisional Patent Application Ser. No. 61/550,312, filed Oct. 21, 2011, which is herein incorporated by reference in its entirety.

BACKGROUND OF THE INVENTION

1. Field of the Invention

Embodiments of the present invention generally relate to a plasma enhanced chemical vapor deposition (PECVD) method and apparatus.

2. Description of the Related Art

Photovoltaic (PV) or solar cells are devices which convert sunlight into direct current (DC) electrical power. A typical PV cell includes a p-type silicon wafer, or substrate, typically less than about 0.3 mm thick, with a thin layer of an n-type silicon material disposed on top of the p-type substrate. When exposed to sunlight, the p-n junction generates pairs of free electrons and holes. An electric field formed across a depletion region of the p-n junction separates the free holes from the free electrons, which may flow through an external circuit or electrical load. The voltage, or photo-voltage, and current generated by the PV cell are dependent on the material properties of the p-n junction, the interfacial properties between deposited layers, and the surface area of the device.

Conventional methods of forming p-n junctions typically include depositing n-type and/or p-type layers via radio frequency (RF) plasma enhanced chemical vapor deposition (PECVD) processes which utilize RF frequencies of less than about 30 MHz. However, conventional RF-PECVD processes often exhibit poor plasma density and limited control over deposition rate, resulting in the deposition of semiconductor layers which lack uniformity and exhibit unsatisfactory doping efficiencies. Moreover, attempting to increase doping efficiencies of conventional RF-PECVD processes typically increases the degree of plasma, charge, and thermal damage in the resulting films, resulting in poor interface passivation characteristics and decreased device performance.

As the foregoing illustrates, there is a need in the art for more effective techniques for depositing solar cell films.

SUMMARY OF THE INVENTION

The present invention generally comprises techniques for performing very high frequency plasma enhanced chemical vapor deposition (VHF-PECVD) of semiconductor thin-films having low process-induced damage and a high degree of uniformity.

One embodiment of the present invention sets forth a method for fabricating a semiconductor layer within a plasma enhanced chemical vapor deposition (PECVD) apparatus. The method includes positioning one or more substrates in the PECVD apparatus. The PECVD apparatus includes a plurality of walls defining a processing region, a substrate support, a shadow frame disposed over the substrate support, a gas distribution showerhead disposed over the substrate support and in fluid communication with the processing region, a gas source in fluid communication with the gas distribution showerhead and the processing region, a radio frequency power source coupled to the gas distribution showerhead, and one or more VHF grounding straps electrically coupled to at least one of the plurality of walls. The one or more VHF grounding straps provide a low-impedance current path between the at least one of the plurality of walls and at least one of a shadow frame or the substrate support. The method further includes delivering a semiconductor precursor gas from the gas source through the gas distribution showerhead to the processing region, delivering a dopant precursor gas from the gas source through the gas distribution showerhead to the processing region, and delivering a very high frequency (VHF) power to the gas distribution showerhead to generate a plasma from the semiconductor precursor gas and dopant precursor gas to form a first layer on the one or more substrates.

Another embodiment of the present invention sets forth a method of fabricating a semiconductor layer. The method includes positioning one or more substrates on a substrate support disposed in a processing region in a plasma enhanced chemical vapor deposition (PECVD) apparatus, delivering a semiconductor-containing precursor gas and a dopant precursor gas into the processing region, and generating a very high frequency (VHF) plasma containing the semiconductor precursor gas and the dopant precursor gas in the processing region. A low-impedance current path between one or more walls of the PECVD apparatus and at least one of the shadow frame and the substrate support allows a current to flow therebetween when the VHF plasma is generated. The method further includes varying a ratio of the semiconductor precursor gas to the dopant precursor gas to form a graded semiconductor layer on the one or more substrates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2E and 2F illustrate an exemplary flexible curtain for use in the processing chambers of FIGS. 2A, 2B, and 3.

FIGS. 12A-D illustrate cell efficiencies, fill factors, open circuit voltages, and current densities of silicon heterojunction solar cells having i-/p-layers deposited by radiofrequency plasma enhanced chemical vapor deposition (RF-PECVD) and very high frequency plasma enhanced chemical vapor deposition (VHF-PECVD) processes.

DETAILED DESCRIPTION

Embodiments of the present invention generally provide a processing system for deposition of semiconductor thin-films having low process-induced damage and a high degree of uniformity. In particular, it has been discovered that, in contrast to conventional radio frequency (RF) plasma enhanced chemical vapor deposition (PECVD) processes which utilize RF frequencies of less than about 30 MHz, semiconductor layers deposited via very high frequency (VHF) PECVD (approximately 30 to 300 MHz) display a low degree of plasma, charge, and thermal damage, resulting in films which exhibit superior interface passivation quality, increased doping efficiency, and an increase in overall heterojunction cell efficiency. Moreover, reduced deposition rates have improved thickness control and process repeatability. Finally, the unique process sequences used to fabricate the thin-film heterojunction layers allow for lower production costs and increased throughput (>2700 wafers/hour).

Figure 1:
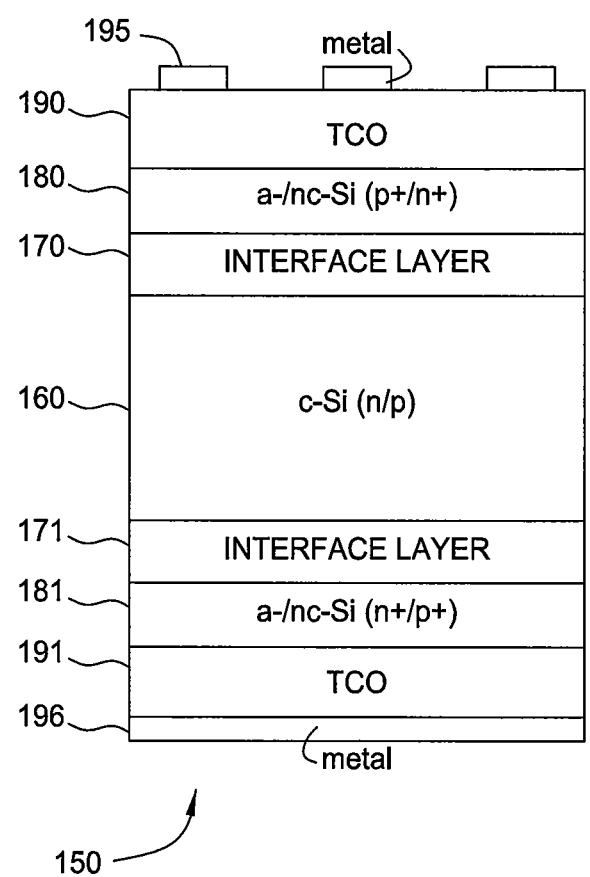
FIG. 1 is a schematic cross-sectional view of a heterojunction (HJ) solar cell according to one embodiment of the present invention.

FIG. 1 is a schematic cross-sectional view of a heterojunction (HJ) solar cell 150 according to one embodiment of the present invention. In embodiments of the invention, the solar cell 150 is a high-efficiency, crystalline silicon thin-film silicon heterojunction (Si-TF HJ) solar cell. The solar cell 150 comprises an n-type or p-type crystalline silicon (c-Si) layer 160. In one embodiment, the c-Si layer 160 may be a silicon wafer sliced from a mono-crystalline or poly-crystalline silicon ingot and having a thickness of about 20 to 300 μm, such as about 160 to 200 μm. In another embodiment, the c-Si layer 160 may be an ultrathin silicon wafer produced by a kerfless wafering process, such as an implant and cleave process or an exfoliation or liftoff process and having a thickness of less than 100 μm, such as about 20-50 μm.

A first interface layer 170 and a second interface layer 171 are disposed on the c-Si layer 160. The interface layers 170, 171 may have a thickness of about 0 to 30 nm, such as about 0 to 10 nm. In one embodiment, the first and second interface layers 170, 171 comprise intrinsic amorphous silicon (a-Si) layers. In other embodiments, the first and second interface layers 170, 171 may comprise a-Si, $SiO_x$, $SiC_x$, and/or $AlO_x$ layers. A first highly-doped $p^+$ or $n^+$ silicon layer 180 may be disposed on the first interface layer 170. The first $p^+/n^+$ layer 180 may be an amorphous (a-Si) or nanocrystalline silicon (nc-Si) layer having a thickness of about 3 to 100 nm, such as about 3 to 20 nm or about 5 to 10 nm. A second highly-doped $n^+$ or $p^+$ silicon layer 181 may be disposed on the second interface layer 171. The second $n^+/p^+$ layer 180 may be an amorphous (a-Si) or nanocrystalline silicon (nc-Si) layer having a thickness of about 3 to 100 nm, such as about 3 to 20 nm or about 5 to 10 nm.

A first transparent conductive oxide (TCO) layer 190 may be disposed on the first $p^+/n^+$ layer 180. A second transparent conductive oxide layer 191 may be disposed on the second $n^+/p^+$ layer 180. In embodiments of the invention, the first and second transparent conductive oxide layers 190, 191 comprise one or more large band gap materials, such as indium tin oxide (ITO), indium tungsten oxide (IWO), or ZnO, which transmit incident radiation to the heterojunction layers disposed below the first and second transparent conductive oxide layers 190, 191. The first and second transparent conductive oxide layers 190, 191 may serve as anti-reflective layers which reduce reflection of light from the solar cell surface, for example, by providing a graded refractive index through which light may travel to the underlying layers of the solar cell. Additionally, the transparent conductive oxide layers 190, 191 may conduct electrical current produced during solar cell operation.

First and second conducting layers 195, 196 may be disposed on the first and second transparent conductive oxide layers 190, 191. The first and second conducting layers 195, 196 may comprise one or more conducting materials, such as copper (Cu), silver (Ag), gold (Au), tin (Sn), cobalt (Co), rhenium (Rh), nickel (Ni), zinc (Zn), lead (Pb), palladium (Pd), molybdenum (Mo), and aluminum (Al) or other metals. In embodiments of the invention, the first and/or second conducting layers 195, 196 may be deposited with physical vapor deposition (PVD), chemical vapor deposition (CVD), evaporation, screen printing, plating, or liftoff metallization processes. Conducting layers 195, 196 which are deposited by PVD or CVD processes, for example, may have thicknesses of about 10 to 5,000 nm, such as about 100 to 500 nm. Conducting layers 195, 196 which are deposited by screen-printing processes may have thicknesses of about 10 to 50 μm, such as about 10 to 20 μm.

The first and/or second conducting layers 195, 196 may be discontinuous layers which provide an ohmic contact with the transparent conductive oxide layers 190, 191, while still allowing incident radiation to reach the underlying silicon layers of the heterojunction solar cell 195. Although FIG. 1 illustrates a single-sided c-Si HJ cell structure which includes a discontinuous front metal layer and a continuous rear metal layer, it is also contemplated that the cell may include a bifacial c-Si HJ structure which includes discontinuous front and rear metal layers.

Silicon heterojunction (HJ) photovoltaics are an important candidate in realizing low-cost production of high-efficiency crystalline silicon (c-Si) type solar cells. Crystalline silicon thin-film silicon (Si-TF) heterojunction solar cells have advantages over conventional c-Si cells, including higher efficiencies, higher operating voltages, and smaller temperature coefficients. However, such cells require low damage for thin-film layer depositions in order to maintain c-Si/TF-Si interface passivation quality and heterojunction cell efficiency.

One embodiment of the invention provides a processing system in which thin-film silicon layers of a heterojunction (HJ) solar cell may be deposited at low ion energies and at temperatures of less than about 250° C. The processing system may use deposition techniques having reduced levels of ion bombardment, such as very high frequency plasma enhanced chemical vapor deposition (VHF-PECVD), inductively coupled plasma plasma enhanced chemical vapor deposition (ICP-PECVD) techniques, and/or ion bombardment-free deposition techniques, such as hot wire chemical vapor deposition (HWCVD).

In other embodiments, the present invention generally provides methods for low-power and/or low-temperature fabrication of solar cell devices having efficiencies of greater than 20%. Such methods may comprise cleaning, texturing, and plasma treating a crystalline silicon (c-Si) wafer, depositing a-Si, $SiO_x$, $SiC_x$, and/or $AlO_x$ interface layers onto the front and the rear of the c-Si wafer, depositing a-Si or nanocrystalline silicon (nc-Si) n-type or p-type layers onto the interface layers, depositing transparent conductive oxide (TCO) layers onto the a-Si or nc-Si n-type or p-type layers, patterning or screen printing front and rear metal layers onto the transparent conductive oxide layers, and optionally performing a low-temperature anneal process.

Embodiments disclosed herein will be discussed with reference to PECVD apparatuses available from APPLIED MATERIALS®, Inc., Santa Clara, Calif. However, it is to be understood that the embodiments discussed herein may have utility in other chambers, including those sold by other manufacturers. The substrate processing system may include one or more deposition chambers in which a batch of substrates is exposed to one or more gas-phase materials and/or RF plasma. In one embodiment, the processing system includes at least one very high frequency plasma enhanced chemical vapor deposition (VHF-PECVD) process chamber that has been adapted to simultaneously process a plurality of substrates. In another embodiment, a batch of solar cell substrates is simultaneously transferred in a vacuum or inert environment to prevent substrate contamination and improve substrate throughput. In the various embodiments of the present invention, each batch of substrates is arranged in a planar array for processing as opposed to processing vertical stacks of substrates (e.g., batches of substrates stacked in cassettes). Processing batches of substrates arranged in planar arrays allows each of the substrates in the batch to be directly and uniformly exposed to the generated plasma, radiant heat, and/or processing gases so that each substrate in the planar array is similarly processed.

Figure 2A:
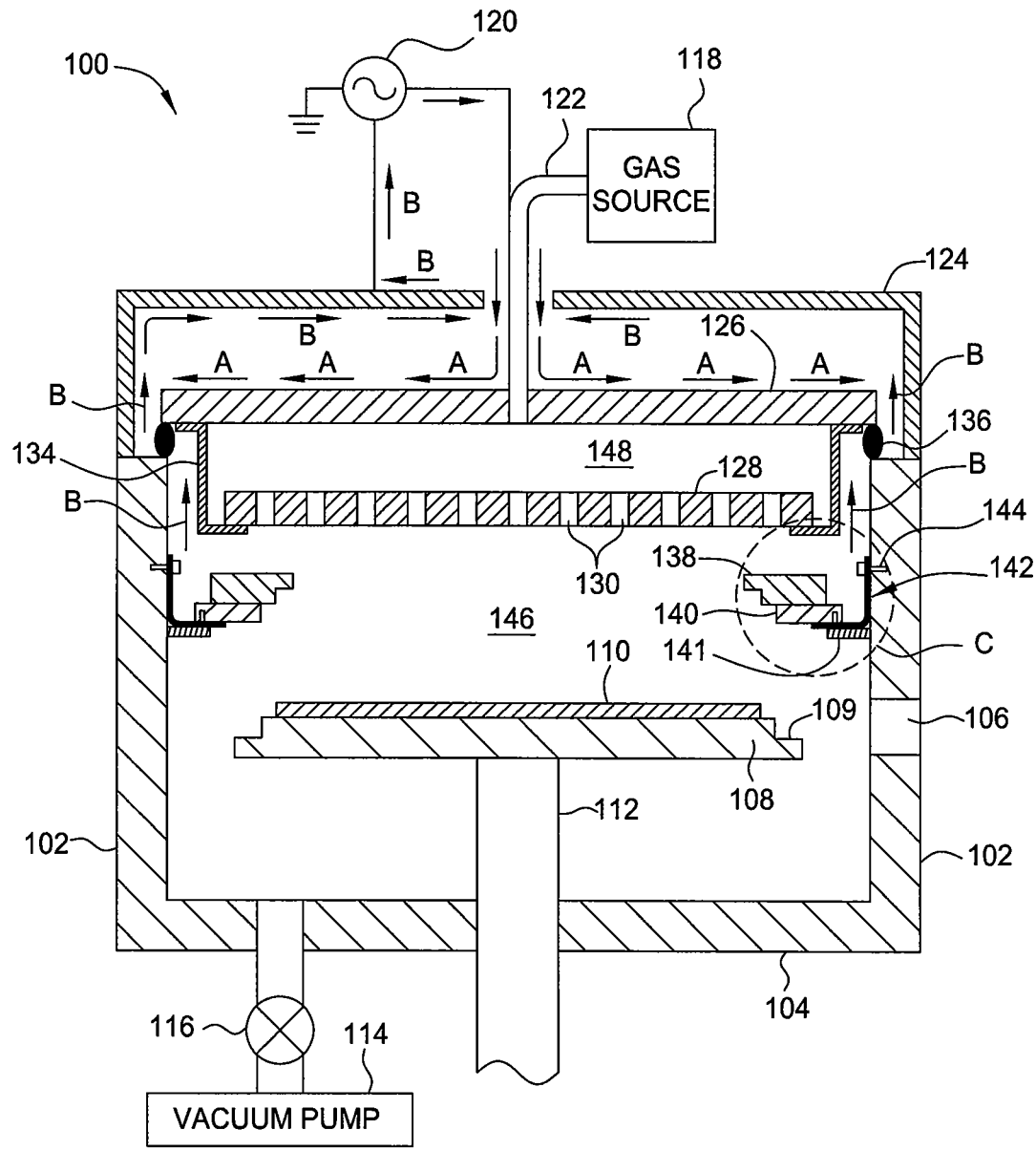
FIG. 2A is a schematic cross-sectional view of a processing chamber, or PECVD apparatus, according to one embodiment of the invention.

FIG. 2A is a schematic cross-sectional view of a processing chamber, or PECVD apparatus 100, according to one embodiment of the invention. The apparatus 100 comprises a plurality of walls 102 and a bottom 104. Through one or more walls 102, a slit valve opening 106 may be present. The slit valve opening 106 permits a substrate 110 to enter and exit the apparatus 100. The substrate 110 may be placed on a substrate support 108 when in the apparatus 100. The substrate support 108 may be raised and lowered on a shaft 112. One or more VHF grounding assemblies 142 are coupled to the plurality of walls 102 by attaching devices 144. The apparatus 100 may be evacuated by a vacuum pump 114. A valve 116 may be coupled between the chamber and the vacuum pump 114 to adjust the vacuum level of the apparatus 100.

Processing gas may be introduced into the apparatus 100 from a gas source 118 through a tube 122 that passes through the chamber lid 124. The tube 122 is coupled to the backing plate 126 to permit the processing gas to pass through the backing plate 126 and enter a plenum 148 between the backing plate 126 and the gas distribution showerhead 128. The processing gas spreads out in the plenum 148 and then passes through gas passages 130 formed through the gas distribution showerhead 128 to the processing area 146.

A power source 120 is coupled to the tube 122. The power source 120 is capable of generating RF currents at a frequency of about 0.4 MHz and about a few hundred MHz. In one embodiment, the RF power source 120 comprises a VHF power source capable of generating VHF currents of approximately 30 to 300 MHz, such as about 40 MHz, about 60 MHz, or about 180 MHz. In other embodiments, the power may be applied such that $1/8^{th}$ of the free space wavelength in vacuum at the applied frequency is comparable to the chamber diagonal. The chamber diagonal is the distance across a rectangular chamber from one corner to another corner diagonally opposite. The power source 120 may generate approximately 50 to 300 watts (W) of power (10-70 mW/cm$^2$) for plasma treatment of the c-Si surface during surface cleaning and passivation. During the deposition of a-Si or nc-Si n-type or p-type layers, the power source 120 may generate approximately 50 to 600 W (10-140 mW/cm$^2$).

The current from the power source 120 flows along the outside surface of the tube 122 to the backing plate 126. RF current has a 'skin effect' in that the current does not penetrate all the way through a conductive body such as the tube 122 and the backing plate 126. RF current travels along the outside surface of a conductive object. The RF current then travels down a suspension 134 to the front face of the gas distribution showerhead 128. In one embodiment, the suspension 134 may comprise a conductive material, such as aluminum. The RF current flows along the paths indicated by arrows "A". Thus, the RF current travels along the back surface of the backing plate 126, the side surface of the backing plate 126, the outside surface of the suspension 134, and the bottom surface of the gas distribution showerhead 128.

In the embodiment shown in FIG. 2, the gas tube 122 is fed into the substantial center of the backing plate 126. Hence, the RF current supplied to the gas tube 122 is also fed to the backing plate 126 at the substantial center thereof. It is to be understood that, the RF current coupling location, could be moved to suit the needs of the user. For example, the RF current coupling location may be moved to compensate for the RF current return or for chamber asymmetry. In other embodiments, the RF current may be coupled to the backing plate 126 at a plurality of locations which are distinct from the location of the gas tube 122.

The VHF grounding assembly 142 generally provides a low-impedance RF current return path between the substrate support 108 and the chamber walls 102. Typically, process chambers are not completely symmetrical. For example, one side of the chamber might have a port (e.g., slit valve opening 106) in the chamber wall 102 for transferring substrates in and out of the process chamber. The chamber walls 102 are part of the RF circuit in a RF plasma chamber. The transfer port (or hole) in one side of the chamber creates an asymmetry in the process chamber. This asymmetry could reduce VHF grounding uniformity, which could result in poorer plasma uniformity and degraded process performance. In general, processes utilizing very high frequency plasma enhanced chemical vapor deposition (VHF-PECVD) require additional grounding as compared to conventional radio frequency plasma enhanced chemical vapor deposition (RF-PECVD) processes.

Figure 2B:
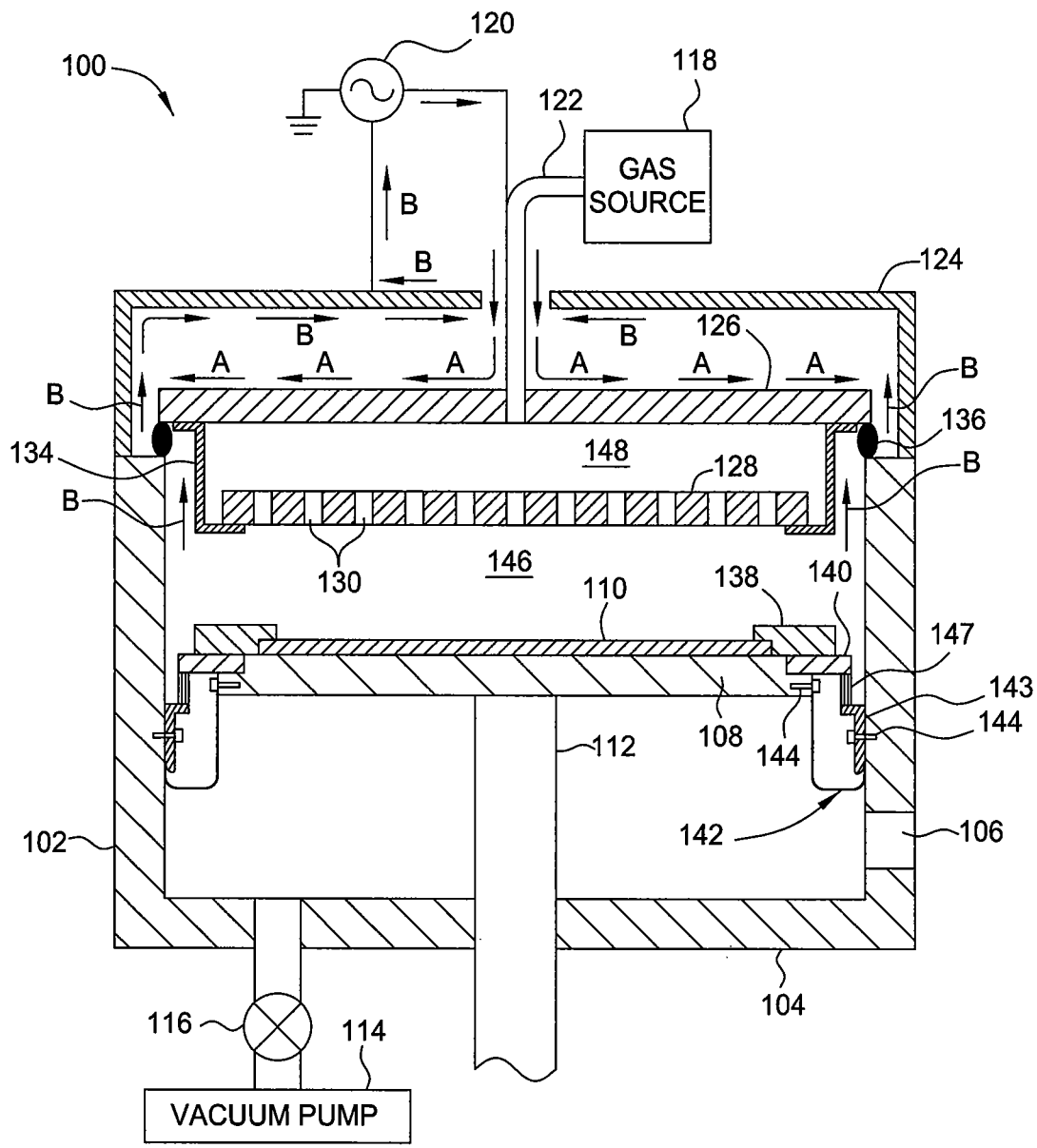
FIG. 2B illustrates a configuration in which VHF grounding assemblies are coupled to both the substrate support and the picked-up blocks disposed beneath the shadow frame.

The configurations in FIGS. 2A and 2B have proven to be effective and reliable for performing VHF-PECVD processes. However, for a RF ground strap to work effectively, its impedance must be low. If the impedance is increased, potential difference could exist across different regions of the substrate support, which may adversely affect deposition uniformity or generate parasitic plasma. Longer traveling distance of the chamber components during the substrate transferring steps requires the VHF grounding straps to be longer, which would increase the impedance of the VHF grounding straps and lower the VHF grounding capability of the straps. Consequently, conventional means of providing grounding in a typical RF-PECVD chamber are often insufficient for use with VHF-PECVD processes. In addition, ineffective VHF grounding allows plasma to travel to the sides and below the substrate support creating unwanted deposition in those areas, which makes cleaning more difficult and more time-consuming.

As shown in FIG. 2A, the substrate support 108 is at a non-substrate-processing position and is not in contact with the VHF grounding assembly 142. The VHF grounding assembly 142 sits on one or more grounding rest-pieces 141 and is supported by the rest-pieces 141 during non-substrate processing period. The substrate support 108 has a substrate 110 on top and has one or more pick-up ledges 109 around the outer perimeter of the top surface of the substrate support 108. The pick-up ledge(s) 109 will pick up the VHF grounding assembly 280 to lift it off the one or more grounding rest-pieces 141 when the substrate support 108 is at the substrate processing position. The VHF grounding assembly 142 is attached to the chamber wall 102 and supports shadow frame 138, which covers the entire edge of the substrate support 108. In one embodiment, the shadow frame 138 is about 3 inches to about 5 inches wide and about ½ to about 1 inch thick.

FIG. 2B illustrates a configuration in which VHF grounding assemblies are coupled to both the substrate support 108 and the picked-up blocks 140 disposed beneath the shadow frame 138. A first VHF grounding assembly 142 is coupled between the substrate support 108 and the chamber wall 102 with attaching devices 144. A second VHF grounding assembly 147 is coupled between the picked-up blocks 140 and the chamber wall 102 with attaching devices (not shown). As shown in FIG. 2B, the substrate support 108 is in a substrate-processing position and is in contact with the picked-up blocks 140. However, as described with respect to FIG. 2A, when the substrate support 108 is in a substrate-processing position, the picked-up blocks 140 are supported by the grounding rest-pieces 143.

Figure 2C:
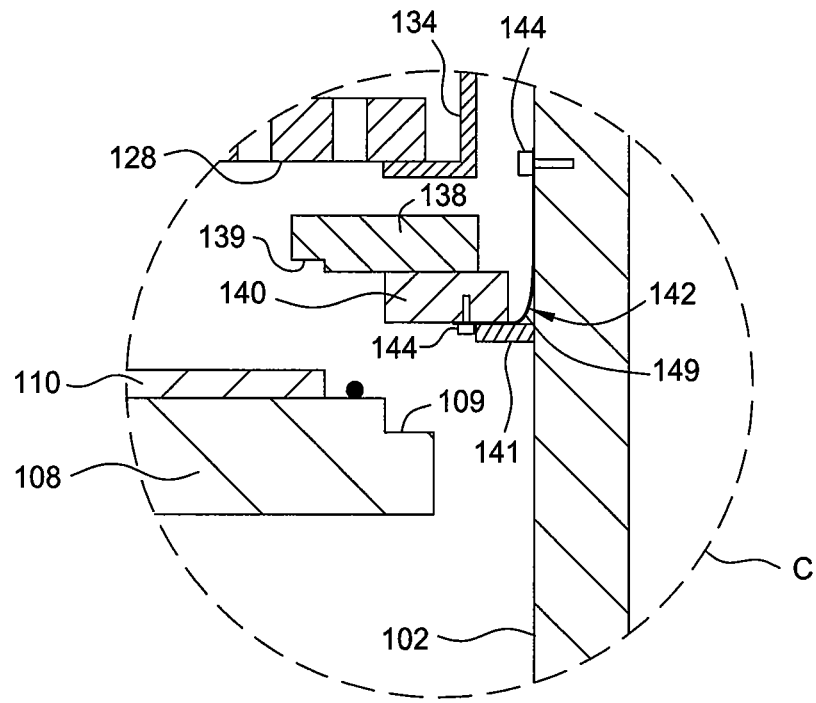
FIG. 2C shows magnified drawings of elements in circle C of FIG. 2A when the substrate support is in a lowered position.

FIG. 2C shows the magnified drawings of elements in circle C of FIG. 2A. The VHF grounding assembly 142 is attached to the chamber wall 102 by applicable means, such as welding, soldering, brazing or by an attaching device 144 (e.g., bolts, screws, etc.). The VHF grounding assembly 142 also comprises one or more low impedance flexible curtains 149, which are attached to the chamber wall 102, and one or more picked-up blocks 140. The one or more flexible curtains 149 are attached to the one or more picked-up blocks 140 by applicable means, such as welding, soldering, brazing or by attaching devices 144.

The low impedance flexible curtains 149 should be made of flexible materials that have a high electrical conductivity, such as an aluminum or copper sheet or foil. The one or more picked-up blocks 140 should be made of low impedance (or high electrical conductivity) blocks, such as aluminum blocks. The one or more picked-up blocks 140 support the shadow frame 138 and are picked up by the pick-up ledge(s) 109 to make contact with the substrate support 108 during substrate processing, such as deposition, to provide the RF return paths (see FIG. 2D below). Each picked-up block 140 is picked up by at least one pick-up ledge 109.

Figure 2D:
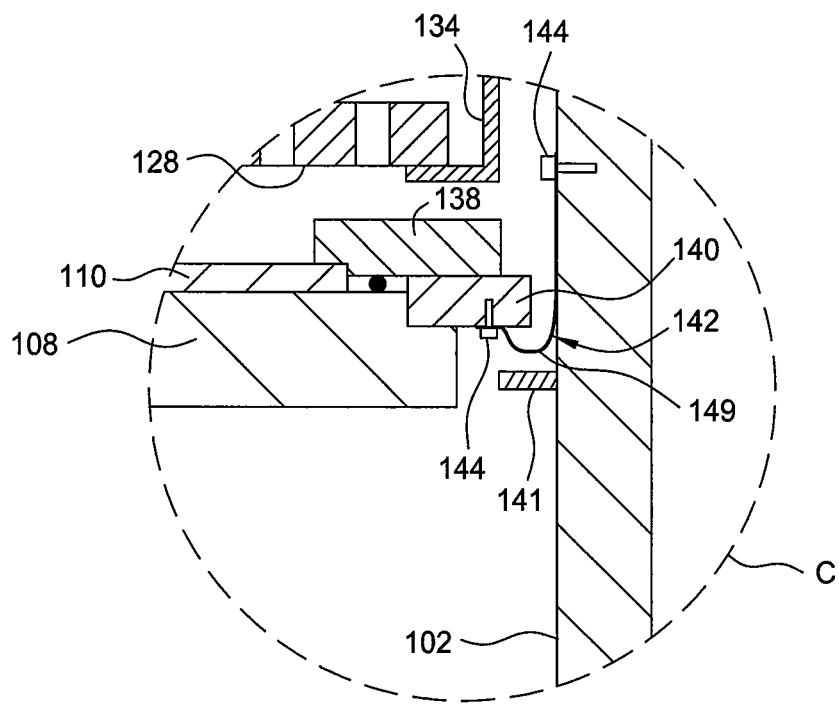
FIG. 2D shows magnified drawings of elements in circle C of FIG. 2A when the substrate support is in a substrate processing position.

FIG. 2C shows magnified drawings of elements in circle C of FIG. 2A when the substrate support 108 is in a lowered position. FIG. 2D shows magnified drawings of elements in circle C of FIG. 2A when the substrate support 108 is in a substrate processing position. During processing, the substrate support 108 is moved closer to the gas distribution showerhead 128. The pick-up ledge 109 picks up the one or more picked-up blocks 140 to lift the VHF grounding assembly 142 off the one or more grounding rest-pieces 141 and makes contact between the substrate support 108 and the VHF grounding assembly 142. The curtain 149 is pushed towards the chamber wall 102 due to the picked-up block 140 being slightly moved up by the pick-up ledge 109. The shadow frame 138, which may be anodized in regions not intended for forming an electrical connection, partially covers the edge of the substrate 110 at the recess 139 of the shadow frame 138. The shadow frame 138 is supported by the edge of the substrate 110, ceramic buttons, which are placed to prevent arching, and picked-up blocks 140, which are on the substrate support 108.

The curtain 149 in FIGS. 2C and 2D may extend continuously around the shadow frame 138 or a portion of the perimeter of the shadow frame 138. In one embodiment, a single curtain 149 extends continuously around substantially the full perimeter of the substrate support 108 (e.g., so that the VHF grounding assembly 142 may contact the edges of the substrate support 108 when it's at the substrate processing position) and is connected to one or more picked-up blocks 140. Alternatively, a plurality of curtains 149 may be positioned adjacent to one another to extend around substantially the full perimeter of the substrate support 108, wherein at least one curtain could be coupled to each edge of the substrate support 108 when it's at the processing position. The plurality of curtains 149 are connected to one or more picked-up blocks 140.

Figure 3:
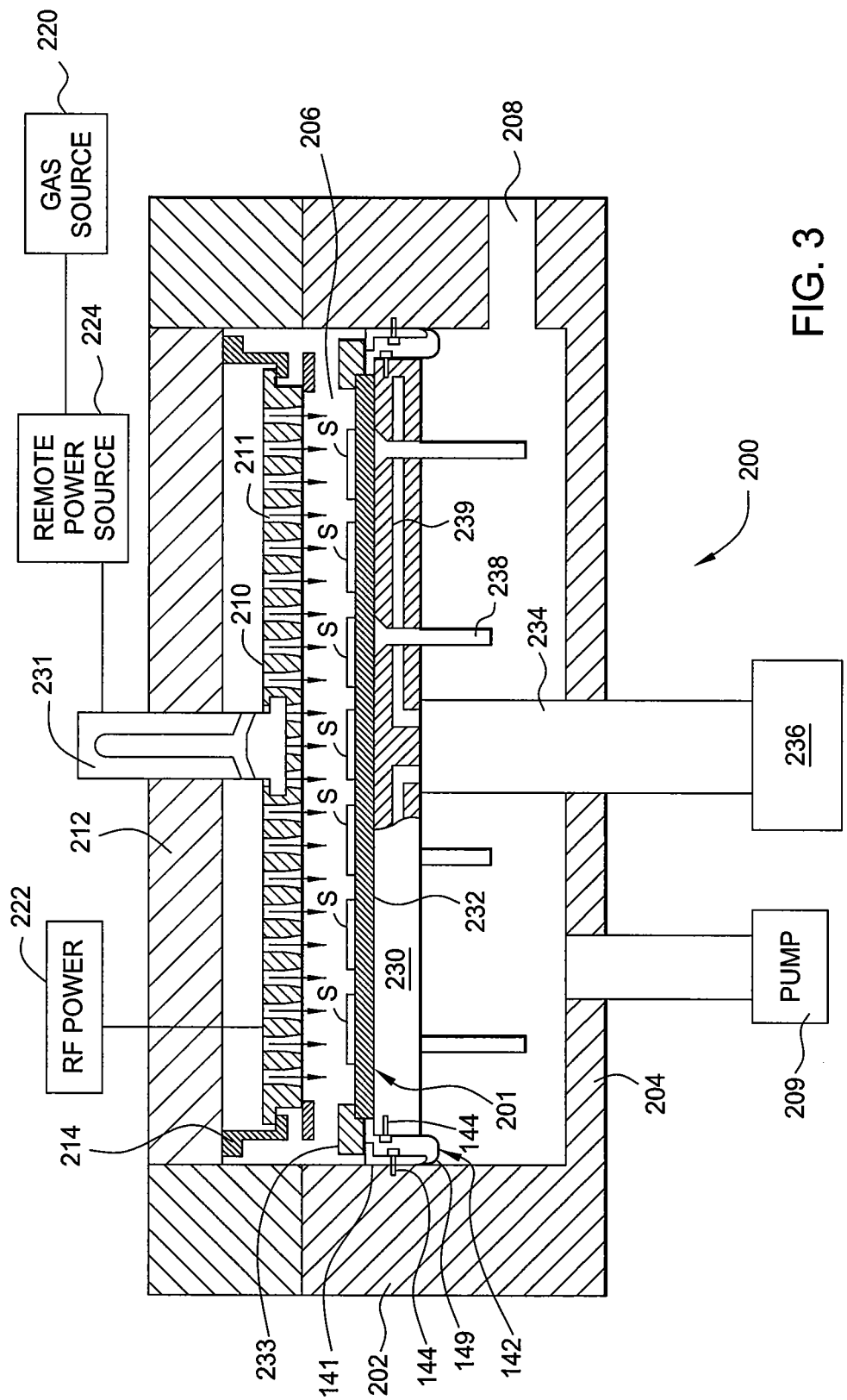
FIG. 3 is a schematic cross-sectional view of a processing chamber, or PECVD apparatus, for performing one or more thin-film solar cell fabrication processes on a planar array, or batch, of substrates S according to one embodiment of the invention.

FIGS. 2E and 2F illustrate an exemplary flexible curtain 149 for use in the processing chambers of FIGS. 2A, 2B, and 3. The flexible curtain 149 may include one or more layers. In one configuration, the flexible curtain 149 includes a flexible layer 252 disposed between two conductive layers 250, 254. The flexible layer 252 may comprise a polymer, such as a polyamide (e.g., Kapton® manufactured by DuPont), and may have a thickness of approximately 0.0005 to 0.003 inches, such as about 0.001 inches. Each conductive layer 250, 254 may comprise a metal, such as aluminum, and may have a thickness of approximately 0.0005 to 0.003 inches, such as about 0.001 inches.

FIG. 3 is a schematic cross-sectional view of a processing chamber, or PECVD apparatus 200, for performing one or more thin-film solar cell fabrication processes on a planar array, or batch, of substrates S according to one embodiment of the invention. One suitable processing system that may be adapted to perform one or more of the processes discussed herein may include a processing platform, such as a Gen 3.5 or Gen. 5 processing platform, available from APPLIED MATERIALS®, Inc., located in Santa Clara, Calif. In one configuration, the PECVD apparatus 200 is adapted to deposit one or more layers on each of the substrates S that are disposed on a carrier 201. The apparatus 200 generally includes walls 202, a bottom 204, a showerhead 210, and a substrate support 230 which define a process volume 206. The process volume 206 is accessed through a valve 208 such that the batch of substrates S, for example, a plurality of substrates S disposed on a substrate carrier 201, may be transferred in and out of the PECVD apparatus 200. The substrate support 230 includes a substrate receiving surface 232 for supporting substrates S and a stem 234 coupled to a lift system 236 to raise and lower the substrate support 230. A shadow frame 233 may be optionally placed over periphery of the carrier 201 that may already have one or more layers formed thereon. Lift pins 238 are moveably disposed through the substrate support 230 to move the carrier 201, or the plurality of substrates S in a carrier-less system, to and from the substrate receiving surface 232. The substrate support 230 may also include heating and/or cooling elements 239 to maintain the substrate support 230 at a desired temperature. One or more VHF grounding assemblies 142 are coupled to the plurality of walls 208, the substrate support 230, and/or other chamber components by attaching devices 144 as described in detail with respect to FIGS. 2A-2F.

The showerhead 210 is coupled to a backing plate 212 at its periphery by a suspension 214. A gas source 220 is coupled to the backing plate 212, providing gas through the backing plate 212 and through the plurality of holes 211 in the showerhead 210 to the substrate receiving surface 232. A vacuum pump 209 is coupled to the PECVD apparatus 200 to control the process volume 206 at a desired pressure. An RF power source 222 is coupled to the backing plate 212 and/or to the showerhead 210 to provide RF power to the showerhead 210, creating an electric field between the showerhead 210 and the substrate support 230 and generating a plasma from the gases between the showerhead 210 and the substrate support 230. Various RF frequencies may be used, such as frequencies between about 0.4 MHz and about a few hundred MHz, including frequencies of about 13.56 MHz, about 40 MHz, about 60 MHz, and about 180 MHz.

A remote plasma source 224, such as an inductively coupled remote plasma source, may be coupled between the gas source 220 and the backing plate 212. Between processing batches of substrates, a cleaning gas may be provided to the remote plasma source 224 to generate a remote plasma which may be provided to clean chamber components. The cleaning gas may be further excited by the RF power source 222 provided to the showerhead 210. Suitable cleaning gases include but are not limited to $NF_3$, $F_2$, and $SF_6$.

Figure 4:
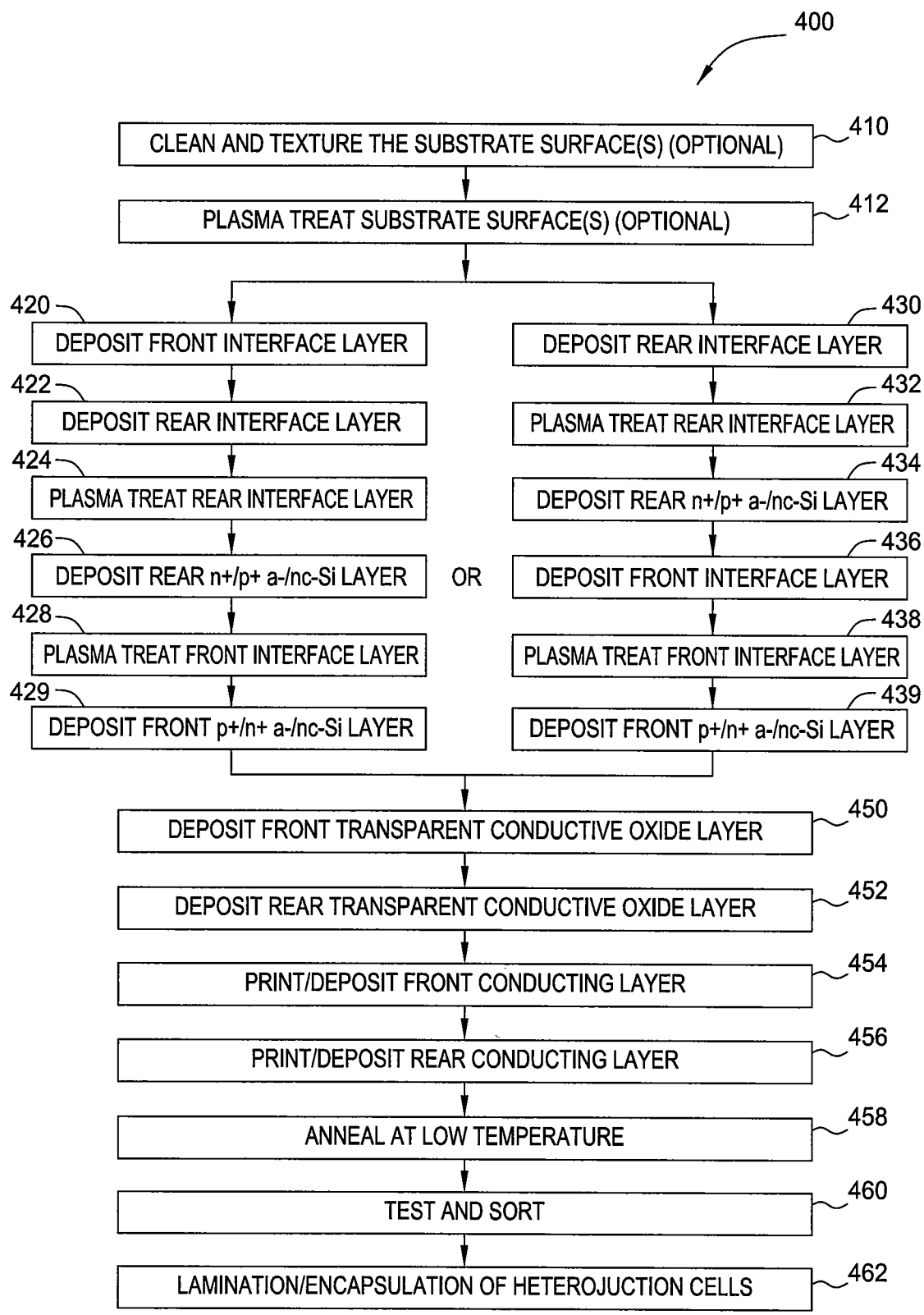
FIG. 4 illustrates a method of fabricating a solar cell device according to one embodiment of the present invention.

FIG. 4 illustrates a method of fabricating a solar cell device 400 according to one embodiment of the present invention. In embodiments of the invention, the processing steps of the method 400 may be performed on a substrate or wafer which may comprise glass or a semiconductor material, such as an n-type or p-type crystalline silicon (c-Si) wafer. The silicon wafer may be sliced from a mono- or poly-silicon ingot grown by the Czochralski (Cz) process. Wafer slicing may be accomplished with a wire saw or inner diameter (ID) saw, for example, to produce a substrate having a thickness of about 20 to 900 µm and a diameter of about 100 to 450 mm. In one embodiment, the substrate has a thickness of about 160 to 200 µm and a diameter of about 200 to 300 mm. After slicing, the surface(s) of the substrate may be polished or treated to remove saw damage. In other embodiments, the substrate may have a quadrilateral or other geometric shape. Such substrates may sliced from mono- or poly-silicon ingots grown through alternative growth processes, for example, a silicon casting process.

One or both surfaces of the substrate may optionally be cleaned 410 to remove surface impurities and native oxide. One or both surfaces of the substrate may also be textured 410 to produce a rough surface. In one embodiment, texturizing the substrate surface(s) may enhance absorption by causing incident light to refract, altering the light's path. Refraction may increase the light's path length through the solar cell, such as by causing the light to strike and reflect off of additional surfaces within the solar cell, increasing the likelihood of absorption. The optional cleaning and texturing of the substrate surface(s) may be performed with basic or acidic compositions such as sodium hydroxide (NaOH) or hydrogen fluoride (HF).

The deposition process steps of the method 400 may use deposition techniques which utilize low processing temperatures, low plasma ion energies, and reduced levels of ion bombardment of the substrate surfaces during deposition. Such techniques include, but are not limited to, very high frequency plasma enhanced chemical vapor deposition (VHF-PECVD), inductively coupled plasma plasma enhanced chemical vapor deposition (ICP-PECVD) techniques and/or ion bombardment-free deposition techniques such as hot wire chemical vapor deposition (HWCVD). The use of low temperatures, low ion energies, and/or low ion bombardment conditions has a number of benefits. For instance, a reduction in damage to one or more of the formed layers by lowering the processing temperatures, plasma ion energies, and ion bombardment of the substrate may improve surface passivation characteristics and increase the quality of interfaces between the deposited layers, increasing minority carrier lifetimes, decreasing series resistance between layers, and, consequently, increasing the performance and efficiency of cells. Moreover, semiconductor layers deposited with VHF-PECVD techniques may achieve higher doping efficiencies, have a lower contact resistance between the formed layers, and have superior passivation at significantly higher deposition rates, particularly when depositing $p^+$-type layers. Doping efficiencies may be improved due to the formation of nanocrystallites during VHF-PECVD processing. Further, the use of low ion bombardment/high plasma density VHF-PECVD techniques allows for increased conductivity and wider band gaps in doped layers.

Prior to layer deposition, one or both surfaces of the c-Si substrate may undergo plasma treatment 412 for about 0 to 60 seconds. Plasma treatment may be accomplished by generating a plasma with a gas source such as a hydrogen ($H_2$), oxygen ($O_2$), nitrogen ($N_2$), or argon (Ar) source. Plasma treatment of the c-Si surface may allow for high-quality passivation of the interfaces between the c-Si surfaces and the a-Si and/or nc-Si layers subsequently deposited thereon. Additionally, plasma treating the c-Si surface may passivate the surface and interface defects and help to further clean the substrate surface, for example, by removing impurities or native oxide layer.

After plasma treatment of the substrate 412, subsequent layer deposition processes may be sequenced in a variety of ways. Two such sequences are illustrated in FIG. 4. In one embodiment, a front interface layer is deposited 420 on the top surface of the substrate, and a rear interface layer is deposited 422 on the bottom surface of the substrate. The interface layers may serve as a buffer between the c-Si layer and the n+/p+ or p+/n+ layers. Additionally, the interface layers may improve passivation of the heterojunction cell layers on which they are disposed.

The interface layers may comprise a-Si, $SiO_x$, $SiC_x$, $AlO_x$ layers having thicknesses of about 0 to 30 nm, including about 0 to 10 nm. The front and rear interface layers may be deposited under similar deposition conditions and may have similar characteristics, or the front and rear interface layers may be deposited under different deposition conditions and may have different characteristics. In one embodiment, the interlace layers are deposited at temperatures of about 100 to 300° C., such as about 120 to 250° C. Forming the interface layers at low temperatures prevents the epitaxial growth, which may negatively affect interface characteristics by increasing the density of dangling bonds at the interface. Additionally, low-temperature deposition may reduce damage, dopant redistribution, and defect density in the interface layers and in the layers on which they are deposited. In another embodiment, the interface layers may be deposited at low pressures of about 0.1 to 2.0 torr, such as about 0.2 to 1.0 torr, allowing for good large-area film uniformity.

Figure 7:
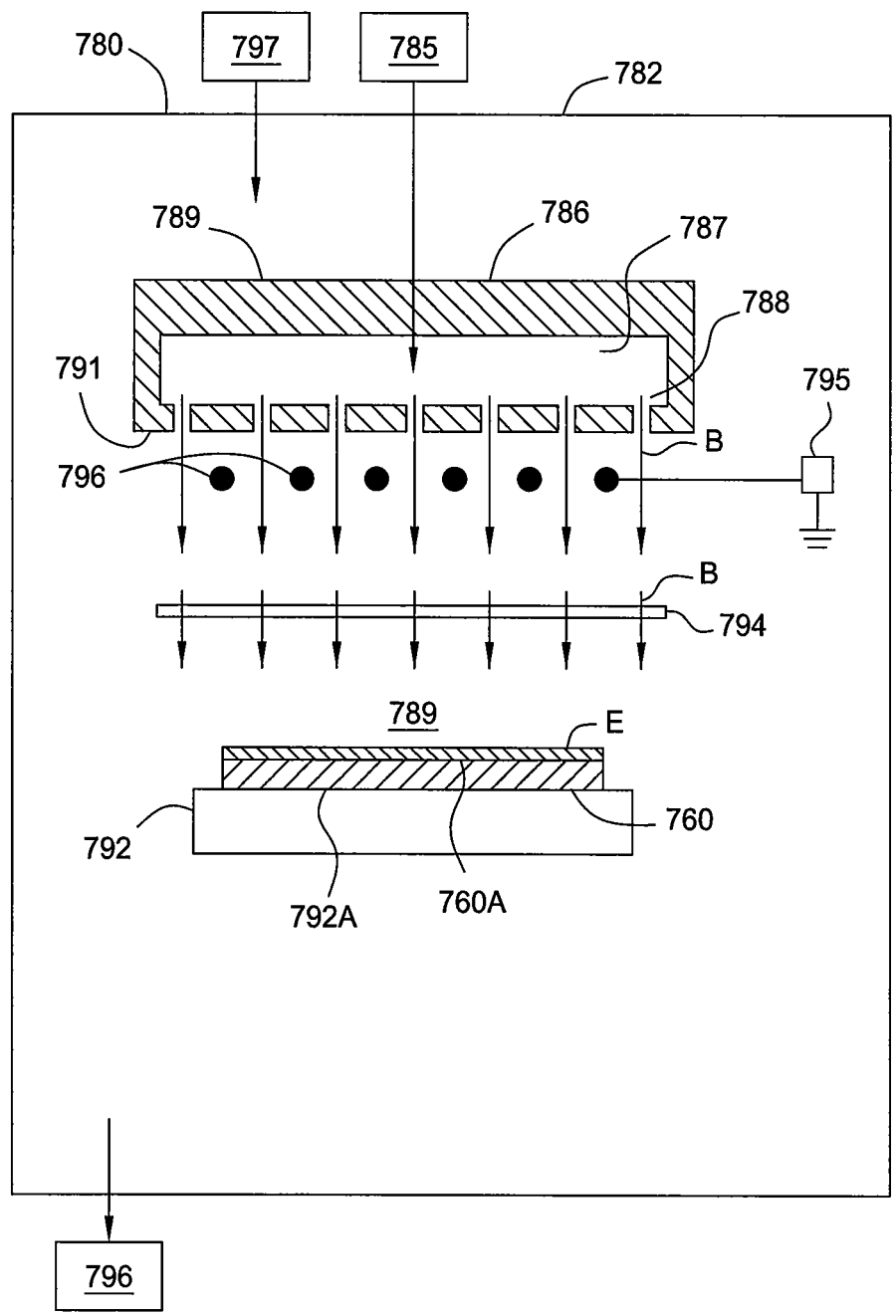
FIG. 7 is a schematic cross-sectional view of a hot wire chemical vapor deposition (HWCVD) apparatus according to one embodiment of the present invention.

In another embodiment of the invention, the interface layers may be deposited with a reduced ion bombardment technique such as inductively coupled plasma enhanced chemical vapor deposition (ICP-PECVD), such as the ICP-PECVD techniques described in U.S. Patent Application Publication No. 2007/0080141 to White et al., which is herein incorporated by reference in its entirety. For example, layers may be deposited via ICP-VHF-PECVD processes. In contrast to ICP-PECVD processes which utilize RF frequencies of less than about 30 MHz, ICP-VHF-PECVD processes allow for the generation of plasma having increased ion densities and decreased ion energies. As a result, layers deposited via ICP-VHF-PECVD exhibit reduced levels of ion bombardment and increased doping efficiencies. In yet another embodiment, the interface layers may be deposited with an ion bombardment-free technique such as hot wire chemical vapor deposition (HWCVD). A HWCVD apparatus having aspects of the present invention is shown in FIG. 7.

During deposition of the interface layers, hydrogen ($H_2$) and silane ($SiH_4$) gases may be used at flow rates having $H_2$:$SiH_4$ ratios which range from about 0 to 30, such as about 0 to 10. Power may be supplied by an RF source at a rate of about 25 to 250 watts (W), such as about 50 to 150 watts (W). In one embodiment, the RF power source supplies VHF power having a frequency of about 30 to 180 MHz, such as about 40 to 60 MHz, including about 40 to 50 MHz, to a capacitively coupled showerhead which is spaced about 520 to 1000 mil from a surface of the substrate. Deposition may occur at rates of less than about 2.5 Å/s. The low-ion energy, low-temperature deposition process may reduce thermal damage and mitigate thermal effects such as wafer bowing. Additionally, the lower ion energies and higher plasma density made possible by VHF-PECVD allow for uniform deposition of a-Si films of less than 10 nm over large areas.

Prior to deposition of the n+/p+ or p+/n+ amorphous/nanocrystalline silicon (a-/nc-Si) layers, one or both of the interface layers may optionally be plasma treated 424, 428 with hydrogen ($H_2$), oxygen ($O_2$), nitrogen ($N_2$), or argon (Ar) gases for about 0 to 30 seconds. In one embodiment, plasma treatment may be performed with $H_2$ plasma with an RF power of approximately 50 to 300 W (10-70 mW/cm$^2$), a pressure of approximately 0.5 to 2.0 Torr, a spacing of approximately 600 to 1000 mil, and a temperature of approximately 120 to 250° C. Plasma treatment of the interface layers is believed to densify the layers and enable the interface layers to reduce diffusion of dopants or impurities between layers, such as between the c-Si and the n+/p+ or p+/n+ layers. In other embodiments, plasma treatment of the interface layers may decrease the defect density of one or more layers, increasing surface/interface passivation quality and prolonging carrier lifetimes.

The rear n+/p+ silicon layer may be deposited 426 on the rear interface layer. Next, after optional plasma treatment of the front interface layer 428, a front p+/n+ silicon layer may be deposited 429 on the front interface layer. In other embodiments, the front surface of the c-Si substrate may be processed before processing of the rear surface of the c-Si substrate. In this embodiment, an interface layer is deposited on the rear surface of the substrate 430, followed by plasma treatment of the rear interface layer 432 and deposition of a rear n+/p+ silicon layer 434 on the rear interface layer. Next, an interface layer is deposited on the front surface of the substrate 436, followed by plasma treatment of the front interface layer 438 and deposition of a front p+/n+ silicon layer 439 on the front interface layer.

The front and rear n+/p+ silicon layers may be highly doped n-type or p-type amorphous silicon (a-Si) or nanocrystalline silicon (nc-Si) layers. In one embodiment, the front and rear n+/p+ silicon layers may comprise nanocrystalline silicon (nc-Si), an allotropic form of silicon having an amorphous phase in which grains of crystalline silicon are present. The front and rear n+/p+ nanocrystalline silicon layers may have thicknesses of about 3 to 30 nm, such as about 5 to 20 nm. The layers may be deposited at temperatures of about 100 to 300° C., such as about 120 to 250° C. Forming the n+/p+ silicon layers at low temperatures may reduce damage to the underlying interface layers and allow for a high-quality, low-resistance interface to be formed with the interface layers. Additionally, low temperatures decrease diffusion of n+/p+ layer dopants through the interface and into the c-Si layer.

The pressures at which the n+/p+ nanocrystalline silicon layers are deposited may be higher than the pressures at which the interface layers are deposited. For example, the n+/p+ silicon layers may be deposited at pressures of about 0.5 to 4 Torr, such as about 1 to 2 torr. Power may be supplied by an RF source at a rate of about 50 to 1500 watts (W), such as about 100 to 500 watts (W). In one embodiment, the RF power source supplies VHF power having a frequency of about 30 to 180 MHz, such as about 40 to 60 MHz, including about 40 to 50 MHz, to a showerhead, which is spaced about 520 to 760 mil from a surface of the substrate. Deposition may occur at rates of less than about 5 Å/s, such as less than about 2.5 Å/s.

Deposition of the n+ nanocrystalline silicon layers may use hydrogen ($H_2$) and silane ($SiH_4$) gases at flow rates having $H_2$:$SiH_4$ ratios which range from about 10 to 150, such as about 25 to 90. The n-type dopant may be provided by a phosphine ($PH_3$) gas (0.5% in $H_2$) at rates of about 30 to 400 standard cubic centimeters per minute (sccm). Deposition of the p+ nanocrystalline silicon layers may use hydrogen ($H_2$) and silane ($SiH_4$) gases at flow rates having $H_2$:$SiH_4$ ratios which range from about 10 to 150, such as about 50 to 90. The p-type dopant may be provided by diborane ($B_2H_6$) and/or trimethylboron (TMB) ($B(CH_3)_3$) gases (0.5% in $H_2$) at rates of about 30 to 400 standard cubic centimeters per minute (sccm).

The front and rear n+/p+ nc-Si layers may be deposited with a low-ion bombardment technique such as VHF-PECVD. Deposition may occur at VHF frequencies similar to those used for the deposition of the interface layers, for example, frequencies of about 40 to 60 MHz, such as about 40 to 50 MHz. The use of VHF-PECVD may allow for higher doping efficiency of the front and rear n+/p+ nc-Si layers, which may in turn increase c-Si surface passivation quality by charge-induced (field-effect) passivation. In another embodiment, the front and rear $n^+/p^+$ nc-Si layers may be deposited with a RF-PECVD technique which has been modified to utilize lower temperatures and ion energies, such as temperatures of about 120 to 250° C. In yet another embodiment, the front and rear $n^+/p^+$ nc-Si layers may be deposited with ICP-PECVD techniques which utilize VHF frequencies.

In other embodiments, the front and rear $n^+/p^+$ silicon layers may comprise amorphous silicon (a-Si) having thicknesses of about 2 to 20 nm, such as about 3 to 10 nm, for $p^+$-type a-Si layers, and thicknesses of about 3 to 30 nm, such as about 5 to 20 nm for $n^+$-type a-Si layers. The front and rear $n^+/p^+$ amorphous silicon layers may be deposited at temperatures of about 100 to 300° C., such as about 120 to 250° C., and at pressures of about 0.1 to 2 torr, such as about 0.5 to 1 torr. Power may be supplied by an RF source at a rate of about 25 to 300 watts (W), such as about 50 to 200 watts (W). The RF power source may supply VHF power having a frequency of about 30 to 180 MHz, such as about 40 to 60 MHz, including about 40 to 50 MHz, to a showerhead which is spaced about 520 to 1000 mil from a surface of the substrate. Deposition may occur at rates of less than about 5 Å/s, such as less than about 2.5 Å/s Deposition of the $n^+$ amorphous silicon layers may use hydrogen ($H_2$) and silane ($SiH_4$) gases at flow rates having $H_2:SiH_4$ ratios which range from about 0 to 20, such as about 0 to 10. The n-type dopant may be provided by a phosphine ($PH_3$) gas (0.5% in $H_2$) at rates of about 30 to 1200 standard cubic centimeters per minute (sccm). Deposition of the $p^+$ amorphous silicon layers may use hydrogen ($H_2$) and silane ($SiH_4$) gases at flow rates having $H_2:SiH_4$ ratios which range from about 0 to 20, such as about 0 to 10. The p-type dopant may be provided by diborane ($B_2H_6$) and/or trimethylboron (TMB) ($B(CH_3)_3$) gases (0.5% in $H_2$) at rates of about 30 to 1200 standard cubic centimeters per minute (sccm).

After deposition of the front and rear $n^+/p^+$ a-/nc-Si layers, front and rear transparent conductive oxide (TCO) layers may be deposited 450, 452. The transparent conductive oxide layers may serve as anti-reflection layers by providing a graded refractive index through which incident radiation may pass. Additionally, the transparent conductive oxide layers may conduct current generated by the heterojunction cell. Consequently, to reduce efficiency losses due to carrier recombination and series resistance, it is important for each transparent conductive oxide layer to have a low-resistivity contact with the underlying heterojunction layer. Superior conductivity may be achieved by depositing each transparent conductive oxide layer on a $n^+/p^+$ nc-Si layer having a high conductivity and carrier mobility, as opposed to an $n^+/p^+$ a-Si layer, which may suffer from lower conductivity due to lower doping efficiency and higher absorption losses. Moreover, $n^+/p^+$ a-Si layers may form blocking contacts with the low-work function ($\phi$) transparent conductive oxide layers.

The transparent conductive oxide layers may be deposited by techniques including physical vapor deposition (PVD), chemical vapor deposition (CVD), or thermal evaporation. In one embodiment, the transparent conductive oxide layers may be deposited by sputtering, for example, with an ATON series sputtering apparatus available from APPLIED MATERIALS®, Inc., Santa Clara, Calif. In embodiments of the invention, the transparent conductive oxide layers may comprise one or more large band gap materials, such as indium tin oxide (ITO), indium tungsten oxide (IWO), or ZnO, which transmit incident radiation to the heterojunction layers disposed below the transparent conductive oxide layers.

Finally, front and rear conducting layers may be formed 454, 456 on the transparent conductive oxide layers. The conducting layers may comprise one or more metals such as copper (Cu), silver (Ag), gold (Au), tin (Sn), cobalt (Co), rhenium (Rh), nickel (Ni), zinc (Zn), lead (Pb), palladium (Pd), molybdenum (Mo), and aluminum (Al) or other metals. The conducting layers may have thicknesses of about 10 to 5,000 nm, such as about 100 to 500 nm, and may be either continuous or discontinuous layers. For example, the conducting layers may be discontinuous layers which provide an ohmic contact with the transparent conductive oxide layers, while still allowing incident radiation to reach the underlying layers of the heterojunction solar cell. In another embodiment, the conducting layers may be continuous blanket layers. The conducting layers may be formed with physical vapor deposition (PVD), chemical vapor deposition (CVD), thermal evaporation, screen printing, plating, or liftoff metallization processes. In one embodiment, the conducting layers may be formed by screen printing, for example, with a Baccini Soft Line apparatus available from APPLIED MATERIALS®, Inc., Santa Clara, Calif. Screen-printed conducting layers may be thicker than conducting layers deposited with PVD or CVD processes. For example, screen-printed conducting layers may have thicknesses of about 10 to 50 μm, such as about 10 to 20 μm.

After completion of deposition processes, the heterojunction cell may be annealed at low temperature 458, for example, at a temperature of about 120 to 230° C., such as a temperature of about 180 to 210° C. In one embodiment, the low-temperature anneal may be performed for about 5 minutes to 2 hours in an $N_2$ environment. In another embodiment, the low-temperature anneal may be performed for about 30 minutes in an $N_2$ environment. In steps 460 and 462, the heterojunction cells may then be tested, sorted, and laminated/encapsulated.

Embodiments of the invention include various sequences of deposition processes. In one embodiment, front and rear intrinsic interface layers are first deposited on the c-Si layer. After plasma treatment of the front and rear interface layers, a rear $n^+$-type nc-Si layer is deposited on the rear interface layer, and a front $p^+$-type nc-Si layer is deposited on the front interface layer. Front and rear transparent conductive oxide layers are then deposited on the front $p^+$-type nc-Si layer and rear $n^+$-type nc-Si layer, and front and rear conducting layers are deposited on the front and rear transparent conductive oxide layers. The resulting heterojunction cell is then annealed at low temperature.

In another embodiment, an intrinsic interface layer is first deposited on the rear surface of the c-Si layer. After plasma treatment of the rear interface layer, a rear $n^+$-type nc-Si layer is deposited on the rear interface layer. An intrinsic interface layer is then deposited on the front surface of the c-Si layer. After plasma treatment of the front interface layer, a front $p^+$-type nc-Si layer is deposited on the front interface layer. Front and rear transparent conductive oxide layers are then deposited on the front $p^+$-type nc-Si layer and rear $n^+$-type nc-Si layer, and front and rear conducting layers are deposited on the front and rear transparent conductive oxide layers. The resulting heterojunction cell is then annealed at low temperature.

Figure 5:
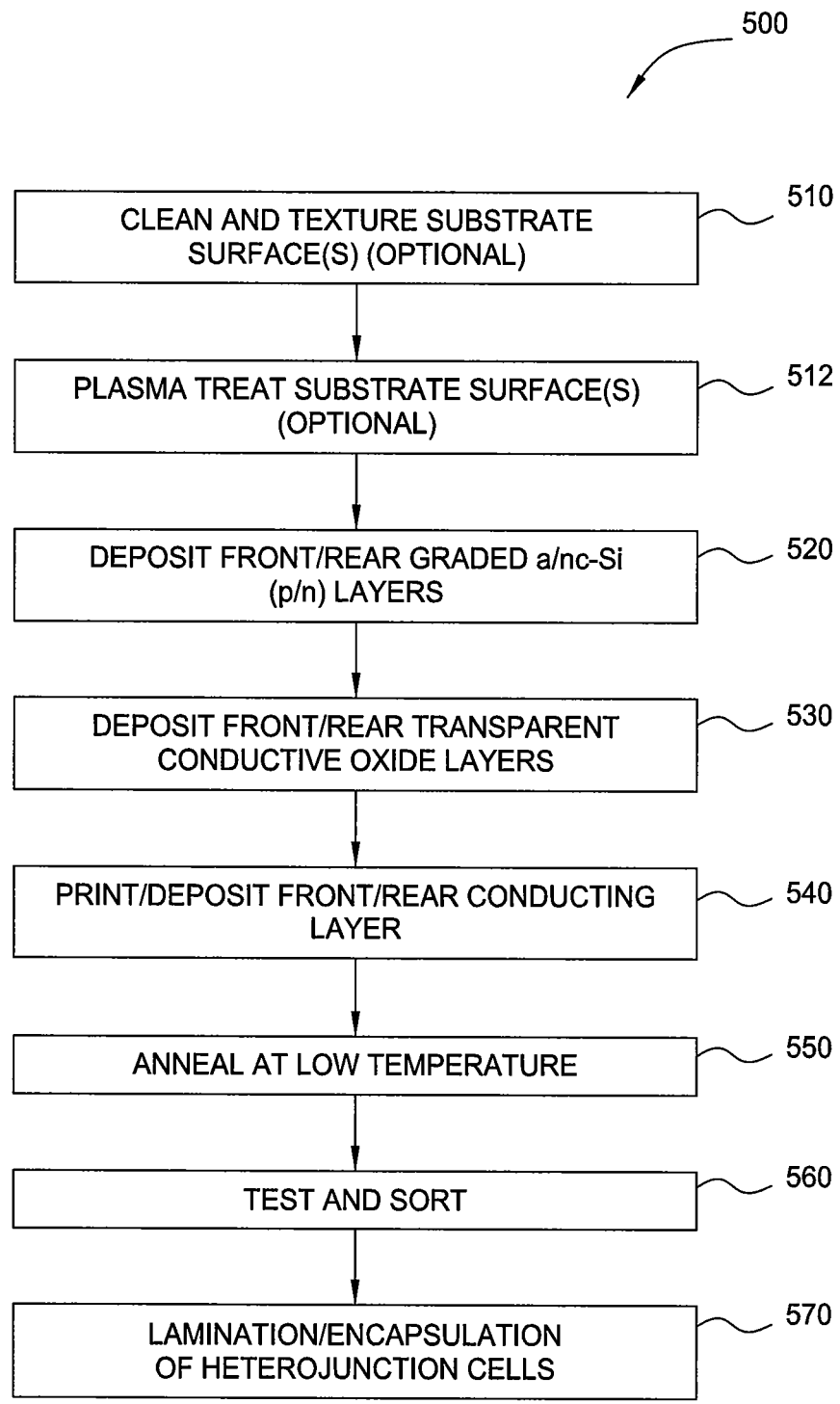
FIG. 5 illustrates a method of fabricating a solar cell device having a graded amorphous/nanocrystalline-silicon (a/nc-Si) layer according to one embodiment of the present invention.

FIG. 5 illustrates a method of fabricating a solar cell device 500 having a graded amorphous/nanocrystalline-silicon (a/nc-Si) layer according to one embodiment of the present invention. The processing steps of the method 500 may be performed on a substrate or wafer which may comprise glass or a semiconductor material, such as an n-type or p-type crystalline silicon (c-Si) wafer, as discussed with respect to the method of FIG. 4.

Advantageously, the VHF-PECVD processes disclosed herein enable the formation of nanocrystallites, which allow for higher doping efficiencies than amorphous layers deposited via conventional RF-PECVD processes. Thus, the method disclosed in FIG. 5 may be utilized to deposit an a/nc-Si layer having a graded doping concentration which varies from no doping (i-a-Si) or micro-doping (p/n-a-Si) to moderate doping ($p^+/n^+$-a-Si) to heavy doping ($p^{++}/n^{++}$-a/nc-Si).

One or both surfaces of the substrate may optionally be cleaned and textured 510 to produce a rough surface. Prior to layer deposition, one or both surfaces of the c-Si substrate may undergo plasma treatment 512 for about 0 to 60 seconds. After plasma treatment of the substrate 512, a graded a/nc-Si (p/n) layer may be deposited on the top surface of the substrate 520.

The process of depositing a graded a/nc-Si (p/n) layer may include varying the ratio of semiconductor precursor to dopant precursor as a function of time. For instance, when depositing a graded p-type a/nc-Si layer, a ratio of diborane ($B_2H_6$) to silane ($SiH_4$) may be gradually increased from about 0 standard cubic centimeters per minute (sccm) to about 30 to 1200 sccm, such that the doping concentration varies over the layer cross section. Other dopant precursors may include, for example, phosphine ($PH_3$), arsine ($AsH_3$), trimethylboron (TMB) ($B(CH_3)_3$) gas, and boron trifluoride ($BF_3$).

In one embodiment, initial layer deposition may be performed with silane gas in combination with a dopant gas having a relatively low (or zero) flow rate. As layer deposition proceeds, the flow rate of dopant gas may be increased and/or the flow rate of silane may be decreased such that the overall ratio of dopant precursor to semiconductor precursor is increased. By varying the flow rate of dopant precursor with respect to the flow rate of semiconductor precursor, a layer having a profile which increases from no doping (intrinsic) or micro-doping (~$10^{16}$ $cm^{-3}$) to heavy doping (~$10^{21}$ $cm^{-3}$) may be achieved in layers having thicknesses of approximately 1 to 30 nm, for example.

Process parameters for the VHF-PECVD deposition of graded semiconductor layers may include a power level of approximately 50 to 600 W (10 to 140 $mW/cm^2$), a pressure of approximately 0.2 to 4.0 Torr, a spacing of approximately 600 to 1000 mil, and a temperature of approximately 120 to 250° C. In other embodiments, a power level of approximately 50 to 300 W (10 to 70 $mW/cm^2$) or 100 to 180 W (20 to 40 $mW/cm^2$), a pressure of approximately 0.5 to 1.5 Torr or approximately 0.75 Torr, and a spacing of approximately 600 to 850 mil may be used. Further, by maintaining a deposition rate of less than approximately 2.5 Å/s, excellent layer uniformity, thickness control, and process repeatability may be achieved. Precursor flow rates may be the same as those described with respect to the method 400 of FIG. 4.

After deposition of the front and rear n/p a-/nc-Si layers, front and rear transparent conductive oxide (TCO) layers may be deposited 530. Finally, front and rear conducting layers may be formed 540 on the transparent conductive oxide layers. After completion of deposition processes, the heterojunction cell may be annealed at low temperature 550. The deposition of the TCO layers and the conducting layers, as well as the annealing step, may be performed in the same manner described with respect to the method 400 of FIG. 4. Finally, in steps 460 and 462, the heterojunction cells may then be tested, sorted, and laminated/encapsulated.

Figure 6:
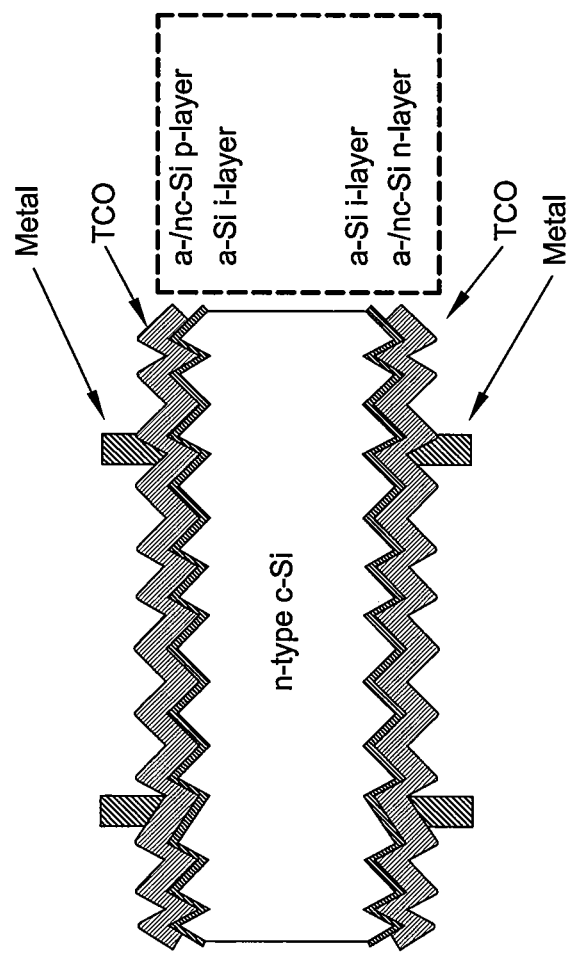
FIG. 6 is a schematic cross-sectional view of a silicon heterojunction (HJ) solar cell design according to one embodiment of the present invention.

FIG. 6 is a schematic cross-sectional view of a silicon heterojunction (HJ) solar cell design according to one embodiment of the present invention. The heterojunction cell includes a textured, n-type c-Si substrate on which silicon thin film, transparent conductive oxide, and metal layers have been deposited.

Embodiments of the present invention include methods in which a substrate, wafer, or batch of substrates/wafers are transferred between a plurality of processing chambers, such as RF-PECVD, VHF-PECVD, ICP-PECVD, HWCVD, sputtering, and/or screen printing or plating chambers, during layer deposition and device fabrication. Also included within the scope of the invention are chamber configurations which allow for complete or partial processing of a solar cell device or silicon heterojunction solar cell device on a wafer, substrate, batch of substrates, or batch of wafers. Such chamber configurations may allow a substrate, wafer, or batch of substrates/wafers to be transferred between chambers while maintaining vacuum conditions.

FIG. 7 is a schematic cross-sectional view of a hot wire chemical vapor deposition (HWCVD) apparatus according to one embodiment of the present invention. The HWCVD apparatus comprises a processing chamber 780 having a processing region 798 and one or more gas sources 785, 797. Disposed in the processing region 798 is a gas delivery device 789 having a fluid plenum 787 and one or more holes 788 formed in a side 791 of the gas delivery device 789. Disposed below the gas delivery device 789 are filaments 796 and a porous shield 794.

In operation, a device substrate 760 may be exposed to an activated processing gas "B" that is delivered through the processing region 798 of the processing chamber 780. In general, the activated process gas may include energetic gas ions, radicals and/or neutrals which may be reactive with one or more of the material components found on the device substrate 760. In one embodiment, the activated process gas is formed by the delivery of thermal energy, RF energy and/or microwave energy to the process gas. Since the act of electrically biasing or grounding the device substrate 760 to cause ion bombardment of the deposited substrate surface, or exposing the substrate surface to energetic neutrals, can cause damage to a thin and flexible device substrate, it is generally desirable to form gas radicals, as opposed to gas ions or energetic neutrals, which are used deposit high-quality, low-damage layers on the device substrate 760.

An activated gas may be delivered to the device substrate 760 while the device substrate 760 is heated to a desirable processing temperature and the processing environment around the device substrate 760 is maintained at a desirable processing pressure. In one embodiment, the activated processing gas includes a hydrogen-containing gas, such as a silane ($SiH_4$), phosphine ($PH_3$), diborane ($B_2H_6$) or trimethylboron (TMB) ($B(CH_3)_3$) gas. In one example, the activated processing gas includes a hydrogen-containing gas and an inert carrier gas (e.g., argon, helium). In another example, the device substrate 760 is maintained at a processing temperature between about 25° C. and about 250° C. and the pressure in the processing region 798 is maintained in a range between about 1 mTorr and 760 Torr. In another example, the device substrate 760 is maintained at a processing temperature between about 110° C. and about 230° C., while the processing region 798 is maintained at a process pressure of about 90 mTorr. In one configuration, the composition of gases disposed in processing region 798 is controlled by the delivery of one or more gases from one of the gas sources 785 or 797 and the removal of the gases by an exhaust pump 766 (e.g., vacuum pump, mechanical pump, scrubber), which are both coupled to the processing region 798.

In the embodiment illustrated in FIG. 7, an activated processing gas may be formed by flowing a process gas through a gas delivery device 789 (e.g., showerhead type gas distribution device) and then across one or more heated filaments 796 that are heated to a desirable temperature to cause the process gas to become activated. It is believed that this type of thermal activation process has an advantage over other gas activation techniques, since it is less complex, the overall chamber hardware cost is low, it has a high activated species yield (e.g., high activated species to non-activated species ratio) and it is less likely to form gas ions or energetic neutrals, which may cause damage to layers of the substrate device 760. In one configuration, a process gas is delivered to fluid plenum 787 formed in the gas delivery device 789 from a process gas source 785, and then through one or more holes 788 formed in a side 791 of the gas delivery device 789. The process gas exiting the one or more holes 788 then flows past the one or more filaments 796 (e.g., 8-12 wires) that are positioned a distance (e.g., 10-22 mm) from the side 791 to form an activated gas "B" that is delivered to a surface 760A of the device substrate 760. The process gas is thus activated by its interaction with the filaments 796, such as tungsten wires, which are heated to a temperature that is between about 1700° C. and about 2200° C. by the delivery of between about 2100 watts (W) and about 3600 watts (W) of power from an AC or DC power source 795.

In one configuration of the processing chamber 780, an optional porous shield 794 is positioned between the side 791 of the gas delivery device 789 and the device substrate 760 to reduce the amount of heat flux from the filaments 796 to the device substrate 760. The optional porous shield 794 may be thermally coupled to the chamber walls 782, and/or to an external heat sink (not shown), to control and/or reduce the amount of heat transferred between it and the device substrate 760. The optional porous shield 794 may comprise a metal, ceramic, or glass material that has a plurality of holes or pores formed therein to allow the activated process gas to flow from the gas delivery device 789 to the device substrate 760.

In one configuration, the device substrate 760 is disposed on a surface 792A of a temperature controlled substrate support 792 to assure that a desired substrate processing temperature is achieved. The temperature controlled substrate support 792 may have one or more fluid type heat exchanging devices, such as the temperature controlling elements, that are adapted to regulate the temperature of the device substrate 760. By positioning the device substrate 760 a desired distance from the one or more filaments 796, and/or using a substrate temperature controlling device (e.g., reference numeral 792), the temperature of the device substrate 760 can be controlled to enhance the properties of the deposited layers and also not degrade the properties of the sometimes fragile device substrate 760. Thus, by use of a reducing gas delivered to a surface of the substrates 760 that has passed across one or more heated filaments 796, which are disposed in a sub-atmospheric pressure environment, heterojunction layers can be directly formed on the device substrate 760. In some configurations, by use of the one or more heated filaments 796, gas delivery device 780 and temperature controlled substrate support 792, and/or optional porous shield 794, high-quality layers having low defect densities and superior interface passivation characteristics may be deposited.

Figures 8A, 8B:
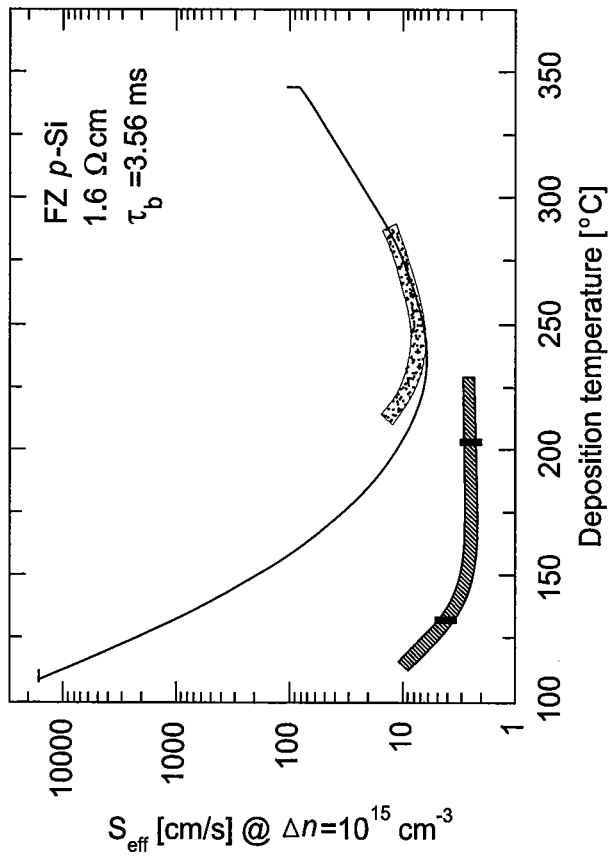
FIG. 8A illustrates radiofrequency plasma enhanced chemical vapor deposition (RF-PECVD) and very high frequency plasma enhanced chemical vapor deposition (VHF-PECVD) processes for fabricating crystalline silicon (c-Si) and amorphous silicon (a-Si) heterojunction (HJ) layers.
FIG. 8B shows improvements in a-Si passivation performance by displaying surface recombination velocity (SRV) characteristics as a function of deposition temperature.

FIG. 8A illustrates radiofrequency plasma enhanced chemical vapor deposition (RF-PECVD) and very high frequency plasma enhanced chemical vapor deposition (VHF-PECVD) processes for fabricating crystalline silicon (c-Si) and amorphous silicon (a-Si) heterojunction (HJ) layers. FIG. 8B shows improvements in a-Si passivation performance by displaying surface recombination velocity (SRV) characteristics as a function of deposition temperature. The results indicate that a reduction in deposition rate may enable better thickness control and process repeatability.

Figure 9A:
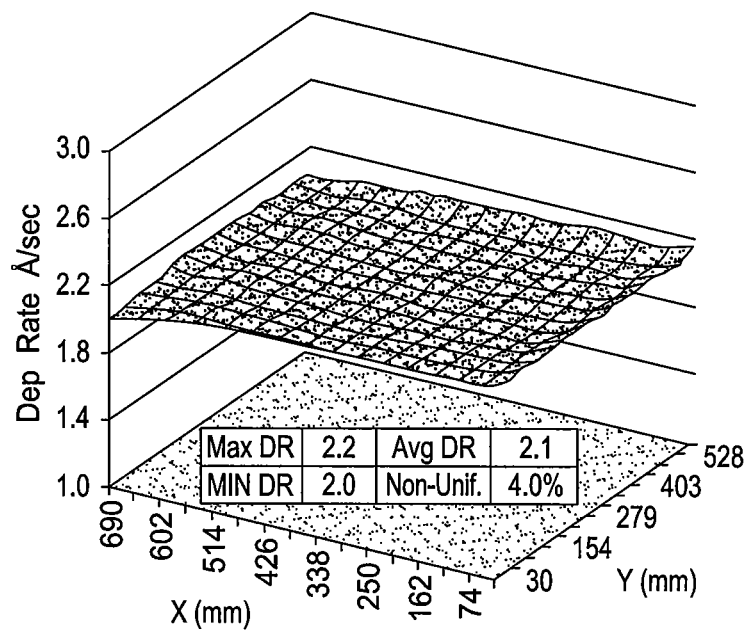
FIGS. 9A and 9B illustrate the uniformity of amorphous silicon (a-Si) layers deposited with radiofrequency plasma enhanced chemical vapor deposition (RF-PECVD) and very high frequency plasma enhanced chemical vapor deposition (VHF-PECVD) processes.
Figure 9B:
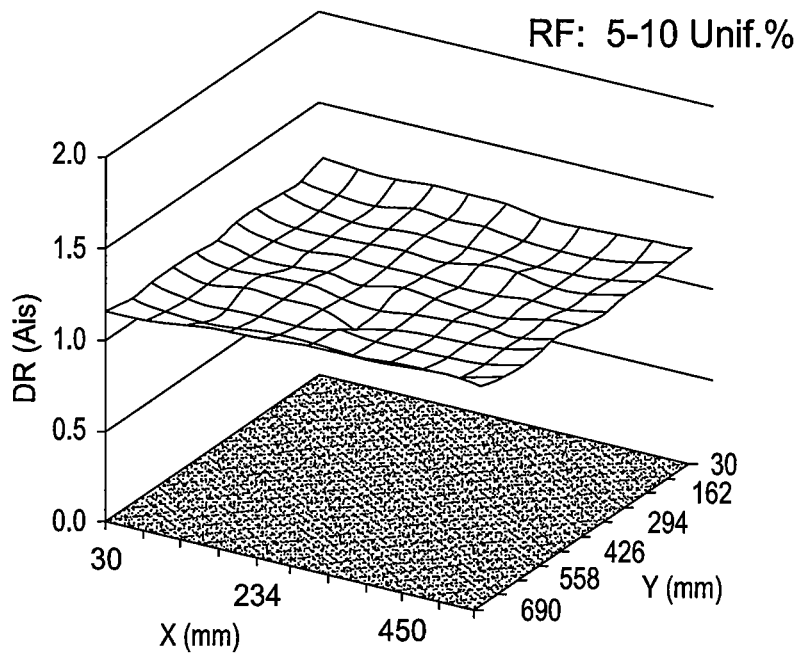

FIGS. 9A and 9B illustrate the uniformity of amorphous silicon (a-Si) layers deposited with radiofrequency plasma enhanced chemical vapor deposition (RF-PECVD) and very high frequency plasma enhanced chemical vapor deposition (VHF-PECVD) processes. The results indicate that VHF-PECVD deposition uniformity is comparable to RF-PECVD deposition uniformity. Additionally, VHF-PECVD depositions were performed with only minor hardware modifications, for example, modifications to apparatus grounding.

Figures 10A, 10B:
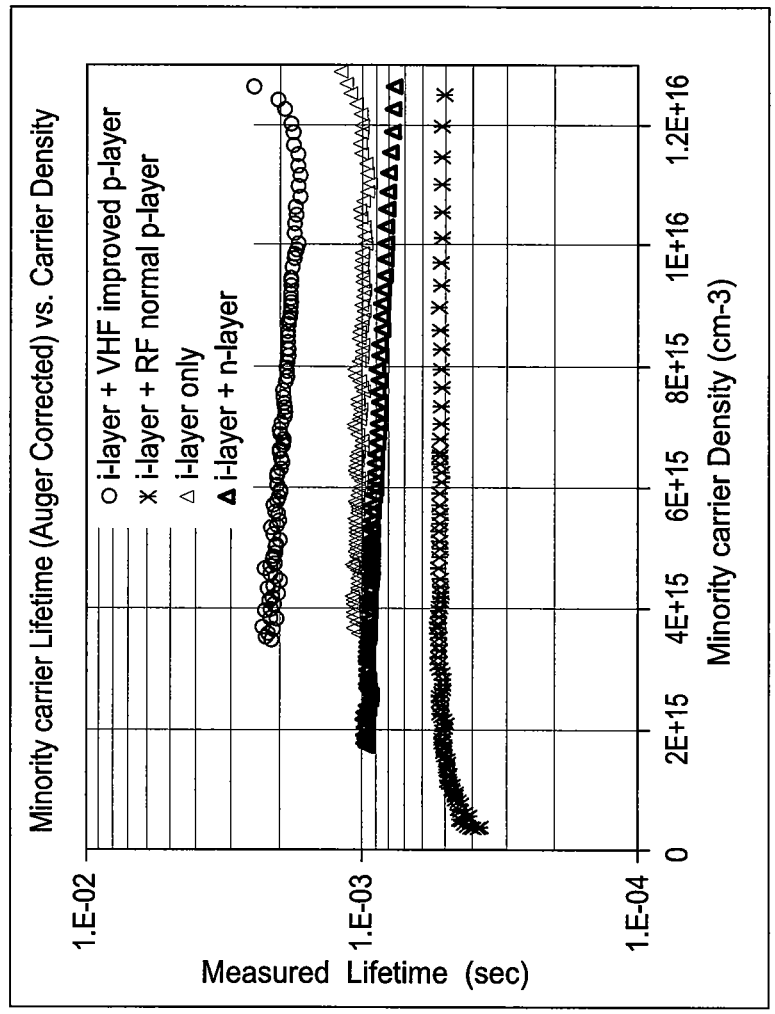
FIGS. 10A and 10B illustrate the minority carrier lifetimes as a function of carrier density for heterojunction cells having different layer and deposition characteristics.

FIGS. 10A and 10B illustrate the minority carrier lifetimes as a function of carrier density for heterojunction cells having different layer and deposition characteristics. The results indicate that very high frequency plasma enhanced chemical vapor deposition (VHF-PECVD) deposition of a p-layer enhances the passivation effects of the underlying interface layer (i-layer). One possible explanation for this enhancement is the high doping efficiency of p-layers deposited with VHF-PECVD, resulting in charge-induced (field-effect) passivation of the p-layer/i-layer and/or i-layer/c-Si layer interfaces. By enhancing passivation, carrier lifetimes of greater than 1.5 ms (i-layer only) and 2 ms (VHF-improved p-layer) were achieved, as compared to the lower than 1 ms carrier lifetimes of the RF deposited p-layers.

Figure 11B:
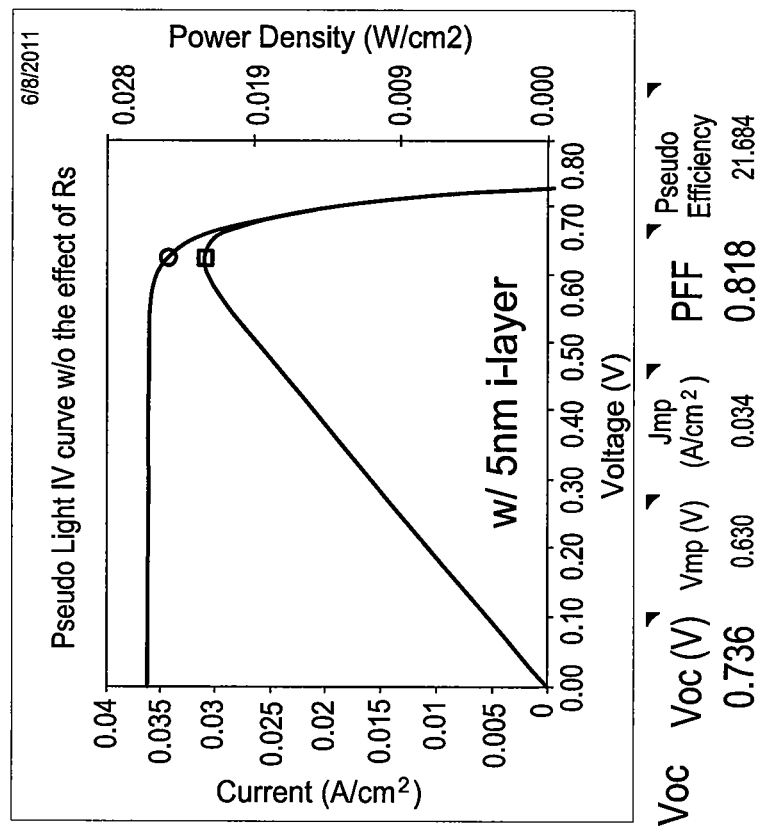
FIGS. 11A and 11B show the pseudo light current-voltage (I-V) curves of silicon heterojunction (HJ) cells with and without an interface layer (i-layer) deposited by very high frequency plasma enhanced chemical vapor deposition (VHF-PECVD) on 1-3 Ω-cm n-type Czochralski (Cz) textured wafers.
Figure 11A:
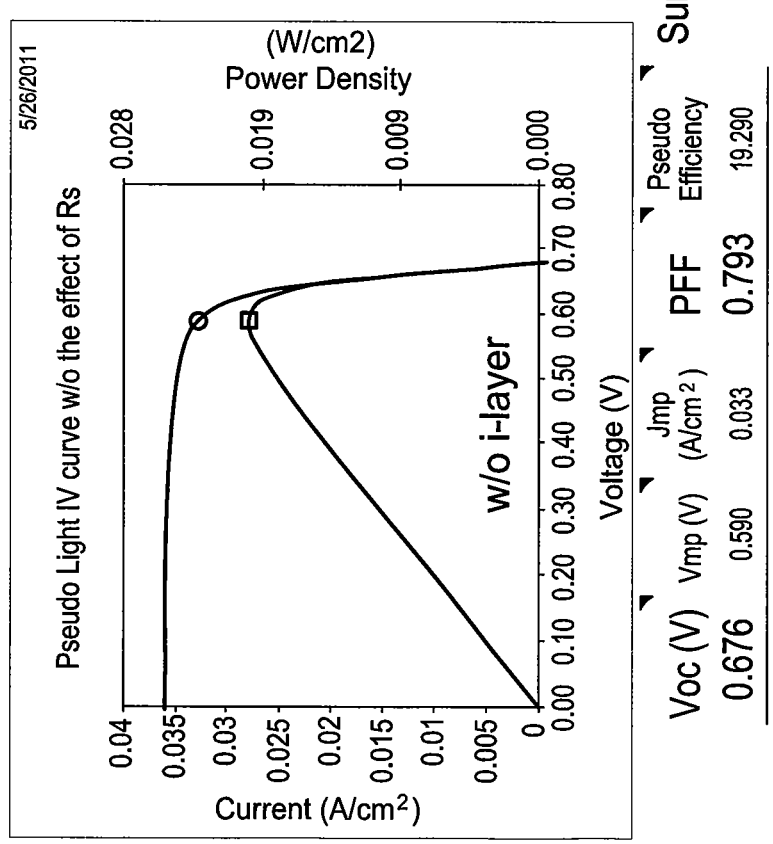

FIGS. 11A and 11B show the pseudo light current-voltage (I-V) curves of silicon heterojunction (HJ) cells with and without an interface layer (i-layer) deposited by very high frequency plasma enhanced chemical vapor deposition (VHF-PECVD) on 1-3 Ω-cm n-type Czochralski (Cz) textured wafers. The results indicate that implied open-circuit voltages ($V_{oc}$) of greater than 670 mV, and an actual $V_{oc}$ of greater than 640 mV, may be achieved without the presence of an i-layer, while an implied $V_{oc}$ of greater than 730 mV, an actual $V_{oc}$ of greater than 720 mV, and a pseudo fill factor (pFF) of 82% may be achieved with a 5 nm i-layer. Additionally, heterojunction cell efficiencies of about 20-21% were achieved with full-size 5 inch and 6 inch n-Cz textured wafers (160 μm), and heterojunction cell efficiencies of about 14.5 to 15% were achieved on ultrathin n-Cz textured wafers having thicknesses of about 20 to 40 μm.

FIGS. 12A-D illustrate cell efficiencies, fill factors, open circuit voltages, and current densities of silicon heterojunction solar cells having i-/p-layers deposited by radiofrequency plasma enhanced chemical vapor deposition (RF-PECVD) and very high frequency plasma enhanced chemical vapor deposition (VHF-PECVD) processes. The results indicate that i-/p-layers formed by VHF-PECVD processes exhibited significant improvements in fill factor, open circuit voltage, and current density, resulting in an ~1% increase in efficiency. It is believed that the efficiency increases were due to increased doping efficiencies in the VHF-PECVD-deposited layers, resulting in lower series resistances with the transparent conductive oxide (TCO) contacts.

Figure 13A:
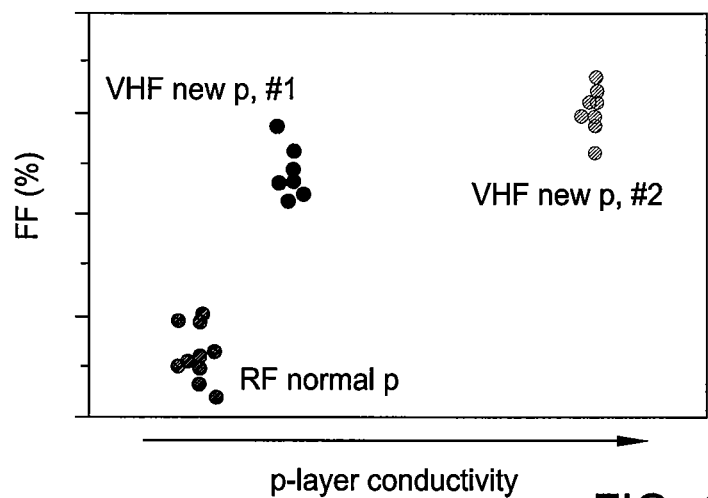
FIGS. 13A-C illustrate fill factors, resistivities, and cell efficiencies of silicon heterojunction solar cells having p-layers deposited by RF-PECVD and VHF-PECVD processes.
Figure 13B:
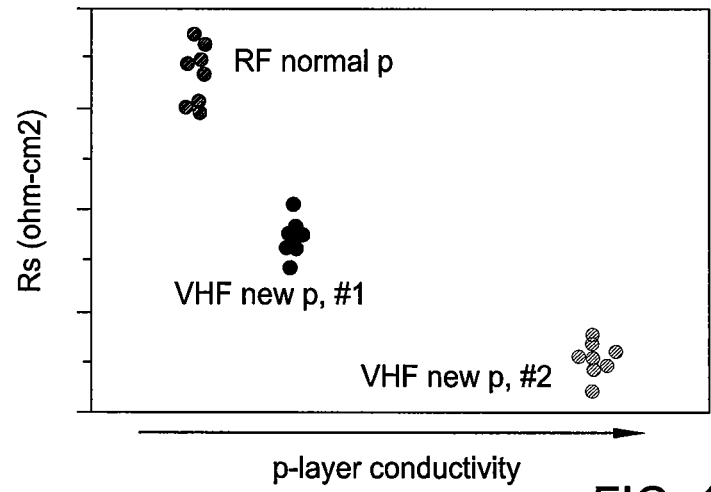
Figure 13C:
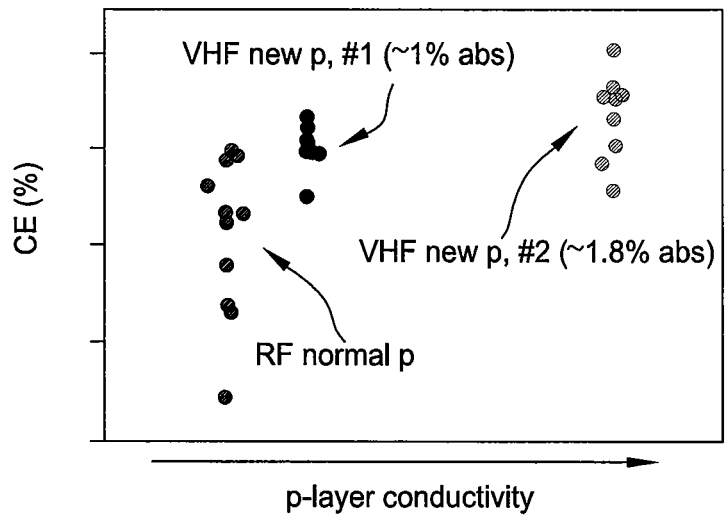

FIGS. 13A-C illustrate fill factors, resistivities, and cell efficiencies of silicon heterojunction solar cells having p-layers deposited by RF-PECVD and VHF-PECVD processes. The results indicate that p-layers formed by VHF-PECVD processes exhibited significant improvement in fill factors by lowering the series resistance of the silicon/transparent conductive oxide (Si/TCO) contacts. Additionally, FIG. 13C indicates that the VHF-PECVD-formed p-layers improved cell efficiency by about 1% and 1.8%.

Figure 14B:
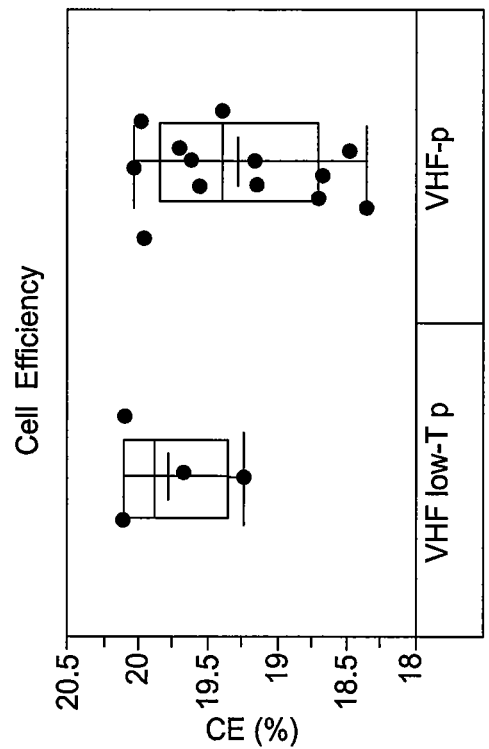
FIGS. 14A and 14B illustrate current densities and cell efficiencies of silicon heterojunction solar cells formed by the method 400 of FIG. 4.
Figure 14A:
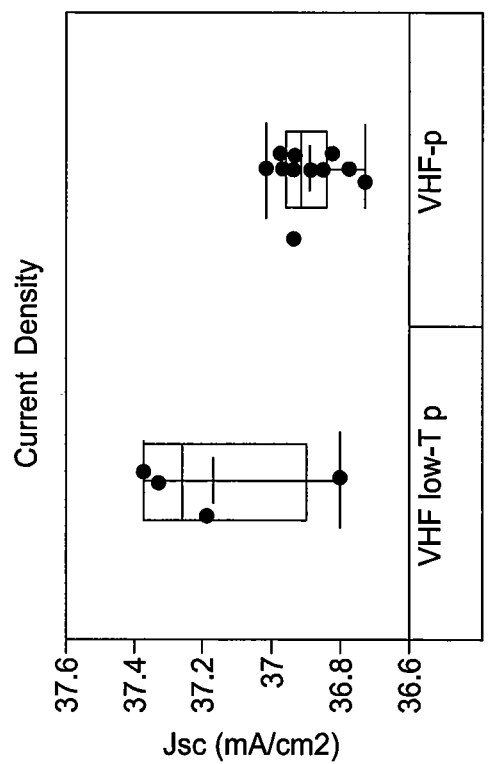

FIGS. 14A and 14B illustrate current densities and cell efficiencies of silicon heterojunction solar cells having p-type layers formed by the method 400 of FIG. 4. Specifically, the low-temperature (low-T) deposition process enabled by VHF-PECVD resulted in deposited layers which displayed a low degree of plasma, charge, and thermal damage, exhibited superior transparency, increased doping efficiency, and an increase in overall heterojunction cell efficiency.

While the foregoing is directed to embodiments of the present invention, other and further embodiments of the invention may be devised without departing from the basic scope thereof, and the scope thereof is determined by the claims that follow.

The invention claimed is:

1. A method for fabricating a semiconductor layer within a plasma enhanced chemical vapor deposition (PECVD) apparatus comprising:
   positioning one or more substrates in the PECVD apparatus, the PECVD apparatus comprising:
      a plurality of walls defining a processing region;
      a substrate support;
      a shadow frame disposed over the substrate support;
      a gas distribution showerhead disposed over the substrate support and in fluid communication with the processing region;
      a gas source in fluid communication with the gas distribution showerhead and the processing region;
      a radio frequency power source coupled to the gas distribution showerhead; and
      one or more VHF grounding straps electrically coupled to at least one of the plurality of walls, wherein the one or more VHF grounding straps provide a low-impedance current path between the at least one of the plurality of walls and at least one of a shadow frame or the substrate support, and the one or more VHF grounding straps are electrically coupled to the shadow frame;
   delivering a semiconductor precursor gas from the gas source through the gas distribution showerhead to the processing region;
   delivering a dopant precursor gas from the gas source through the gas distribution showerhead to the processing region; and
   delivering a very high frequency (VHF) power to the gas distribution showerhead to generate a plasma from the semiconductor precursor gas and dopant precursor gas to form a first layer on the one or more substrates.

2. The method of claim 1, wherein the VHF current has a frequency from about 20 megahertz (MHz) to about 180 MHz.

3. The method of claim 1, wherein the VHF current has a frequency from about 40 MHz to about 60 MHz.

4. The method of claim 1, wherein depositing the first layer comprises depositing a graded semiconductor layer by varying a ratio of the semiconductor precursor gas to the dopant precursor gas.

5. The method of claim 1, wherein the dopant precursor gas is selected from the group consisting of phosphine ($PH_3$), arsine ($AsH_3$), diborane ($B_2H_6$), trimethylboron (TMB) ($B(CH_3)_3$) gas, and boron trifluoride ($BF_3$).

6. A method for fabricating a semiconductor layer within a plasma enhanced chemical vapor deposition (PECVD) apparatus comprising:
   positioning one or more substrates in the PECVD apparatus, the PECVD apparatus comprising:
      a plurality of walls defining a processing region;
      a substrate support;
      a shadow frame disposed over the substrate support;
      a gas distribution showerhead disposed over the substrate support and in fluid communication with the processing region;
      a gas source in fluid communication with the gas distribution showerhead and the processing region;
      a radio frequency power source coupled to the gas distribution showerhead; and
      one or more VHF grounding straps electrically coupled to at least one of the plurality of walls, wherein the one or more VHF grounding straps provide a low-impedance current path between the at least one of the plurality of walls and at least one of a shadow frame or the substrate support, and the one or more VHF grounding straps are electrically coupled to one or more picked-up blocks;
   delivering a semiconductor precursor gas from the gas source through the gas distribution showerhead to the processing region;
   delivering a dopant precursor gas from the gas source through the gas distribution showerhead to the processing region; and
   delivering a very high frequency (VHF) power to the gas distribution showerhead to generate a plasma from the semiconductor precursor gas and dopant precursor gas to form a first layer on the one or more substrates.

7. A method for fabricating a semiconductor layer within a plasma enhanced chemical vapor deposition (PECVD) apparatus comprising:
   positioning one or more substrates in the PECVD apparatus, the PECVD apparatus comprising:
      a plurality of walls defining a processing region;
      a substrate support;
      a shadow frame disposed over the substrate support;
      a gas distribution showerhead disposed over the substrate support and in fluid communication with the processing region;
      a gas source in fluid communication with the gas distribution showerhead and the processing region;
      a radio frequency power source coupled to the gas distribution showerhead; and
      one or more VHF grounding straps electrically coupled to at least one of the plurality of walls, wherein the one or more VHF grounding straps provide a low-impedance current path between the at least one of the plurality of walls and at least one of a shadow frame or the substrate support, and a first VHF grounding strap of the one or more VHF grounding straps is electrically coupled to the shadow frame and a second VHF grounding strap of the one or more VHF grounding straps is electrically coupled to one or more picked-up blocks;
   delivering a semiconductor precursor gas from the gas source through the gas distribution showerhead to the processing region;
   delivering a dopant precursor gas from the gas source through the gas distribution showerhead to the processing region; and
   delivering a very high frequency (VHF) power to the gas distribution showerhead to generate a plasma from the semiconductor precursor gas and dopant precursor gas to form a first layer on the one or more substrates.

8. A method for fabricating a semiconductor layer within a plasma enhanced chemical vapor deposition (PECVD) apparatus comprising:
   positioning one or more substrates in the PECVD apparatus, the PECVD apparatus comprising:

a plurality of walls defining a processing region;
a substrate support;
a shadow frame disposed over the substrate support;
a gas distribution showerhead disposed over the substrate support and in fluid communication with the processing region;
a gas source in fluid communication with the gas distribution showerhead and the processing region;
a radio frequency power source coupled to the gas distribution showerhead; and
one or more VHF grounding straps electrically coupled to at least one of the plurality of walls, wherein the one or more VHF grounding straps provide a low-impedance current path between the at least one of the plurality of walls and at least one of a shadow frame or the substrate support, and the one or more VHF grounding straps comprise a first flexible layer disposed between two conductive layers;
delivering a semiconductor precursor gas from the gas source through the gas distribution showerhead to the processing region;
delivering a dopant precursor gas from the gas source through the gas distribution showerhead to the processing region; and
delivering a very high frequency (VHF) power to the gas distribution showerhead to generate a plasma from the semiconductor precursor gas and dopant precursor gas to form a first layer on the one or more substrates.

9. The method of claim 8, wherein the first flexible layer comprises a polymer and the two conductive layers comprise aluminum.

10. A method of fabricating a semiconductor layer comprising:
positioning one or more substrates on a substrate support disposed in a processing region in a plasma enhanced chemical vapor deposition (PECVD) apparatus;
delivering a semiconductor-containing precursor gas and a dopant precursor gas into the processing region;
generating a very high frequency (VHF) plasma containing the semiconductor precursor gas and the dopant precursor gas in the processing region, wherein a low-impedance current path between one or more walls of the PECVD apparatus and at least one of the shadow frame and the substrate support allows a current to flow therebetween when the VHF plasma is generated, the low-impedance current path is provided with one or more VHF grounding straps electrically coupled to the one or more walls of the PECVD apparatus, and the one or more VHF grounding straps are electrically coupled to the shadow frame; and
varying a ratio of the semiconductor precursor gas to the dopant precursor gas to form a graded semiconductor layer on the one or more substrates.

11. The method of claim 10, wherein the VHF current has a frequency from about 20 megahertz (MHz) to about 180 MHz.

12. The method of claim 10, wherein the VHF current has a frequency from about 40 MHz to 60 about MHz.

13. The method of claim 10, wherein the dopant precursor gas is selected from the group consisting of phosphine ($PH_3$), arsine ($AsH_3$), diborane ($B_2H_6$), trimethylboron (TMB) ($B(CH_3)_3$) gas, and boron trifluoride ($BF_3$).

14. The method of claim 10, wherein the one or more VHF grounding straps are electrically coupled to the substrate support.

15. A method of fabricating a semiconductor layer comprising:
positioning one or more substrates on a substrate support disposed in a processing region in a plasma enhanced chemical vapor deposition (PECVD) apparatus;
delivering a semiconductor-containing precursor gas and a dopant precursor gas into the processing region;
generating a very high frequency (VHF) plasma containing the semiconductor precursor gas and the dopant precursor gas in the processing region, wherein a low-impedance current path between one or more walls of the PECVD apparatus and at least one of the shadow frame and the substrate support allows a current to flow therebetween when the VHF plasma is generated, the low-impedance current path is provided with one or more VHF grounding straps electrically coupled to the one or more walls of the PECVD apparatus, and a first VHF grounding strap of the one or more VHF grounding straps is electrically coupled to the shadow frame and a second VHF grounding strap of the one or more VHF grounding straps is electrically coupled to one or more picked-up blocks of the PECVD apparatus; and
varying a ratio of the semiconductor precursor gas to the dopant precursor gas to form a graded semiconductor layer on the one or more substrates.

16. A method of fabricating a semiconductor layer comprising:
positioning one or more substrates on a substrate support disposed in a processing region in a plasma enhanced chemical vapor deposition (PECVD) apparatus;
delivering a semiconductor-containing precursor gas and a dopant precursor gas into the processing region;
generating a very high frequency (VHF) plasma containing the semiconductor precursor gas and the dopant precursor gas in the processing region, wherein a low-impedance current path between one or more walls of the PECVD apparatus and at least one of the shadow frame and the substrate support allows a current to flow therebetween when the VHF plasma is generated, the low-impedance current path is provided with one or more VHF grounding straps electrically coupled to the one or more walls of the PECVD apparatus, and the one or more VHF grounding straps comprise a first flexible layer disposed between two conductive layers; and
varying a ratio of the semiconductor precursor gas to the dopant precursor gas to form a graded semiconductor layer on the one or more substrates.

17. The method of claim 16, wherein the first flexible layer comprises a polymer and the two conductive layers comprise aluminum.

* * * * *

UNITED STATES PATENT AND TRADEMARK OFFICE
CERTIFICATE OF CORRECTION

PATENT NO. : 8,728,918 B2
APPLICATION NO. : 13/656420
DATED : May 20, 2014
INVENTOR(S) : Sheng et al.

Page 1 of 1

It is certified that error appears in the above-identified patent and that said Letters Patent is hereby corrected as shown below:

In the Specification

Column 11, Line 11, please delete "interlace" and insert -- interface -- therefor.

Signed and Sealed this
Ninth Day of September, 2014

Michelle K. Lee
*Deputy Director of the United States Patent and Trademark Office*